US007161207B2

(12) United States Patent
Hamaguchi et al.

(10) Patent No.: US 7,161,207 B2
(45) Date of Patent: Jan. 9, 2007

(54) COMPUTER SYSTEM, MEMORY STRUCTURE AND STRUCTURE FOR PROVIDING STORAGE OF DATA

(75) Inventors: Koji Hamaguchi, Tenri (JP); Masaru Nawaki, Nara (JP); Yoshinao Morikawa, Ikoma (JP); Hiroshi Iwata, Ikoma-gun (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/840,173

(22) Filed: May 5, 2004

(65) Prior Publication Data

US 2004/0222456 A1    Nov. 11, 2004

(30) Foreign Application Priority Data

May 9, 2003    (JP) ............................. 2003-132005

(51) Int. Cl.
*H01L 29/79* (2006.01)
(52) U.S. Cl. ....................................... 257/324; 257/320
(58) Field of Classification Search ................ 257/320, 257/324
See application file for complete search history.

(56) References Cited

U.S. PATENT DOCUMENTS 5,537,350 A * 7/1996 Larsen et al. .......... 365/185.33
5,838,041 A * 11/1998 Sakagami et al. .......... 257/324
2002/0040992 A1* 4/2002 Manabe et al. ............. 257/314
2003/0164517 A1* 9/2003 Kamei et al. ................ 257/314
2004/0233717 A1* 11/2004 Morikawa et al. ..... 365/185.11

FOREIGN PATENT DOCUMENTS

JP        05-304277      11/1993

* cited by examiner

*Primary Examiner*—Thomas L. Dickey
(74) *Attorney, Agent, or Firm*—Morrison & Foerster LLP

(57) ABSTRACT

A computer system comprising: (A) a CPU; (B) a memory arrangement comprising: (i) a side-wall memory array including a plurality of side-wall memory transistors; (ii) a charge pump; (iii) a plurality of switching circuits; and (iv) logic circuitry; and (C) a system bus, wherein each of the side-wall memory transistors comprises: a gate electrode formed on a semiconductor layer with a gate insulating film formed on the semiconductor layer; a channel region formed below the gate electrode; a pair of diffusion regions formed on the both sides of the channel region and having a conductive type opposite to that of the channel region; and a pair of memory functional units formed on the both sides of the gate electrode and having a function of retaining charges.

31 Claims, 17 Drawing Sheets

US 7,161,207 B2

COMPUTER SYSTEM, MEMORY STRUCTURE AND STRUCTURE FOR PROVIDING STORAGE OF DATA

CROSS-REFERENCE TO RELATED APPLICATION

This application is related to Japanese application No. 2003-132005 filed on May 9, 2003, whose priority is claimed under 35 USC § 119, the disclosure of which is incorporated by reference in its entirety.

BACKGROUND OF THE INVENTION

1. Field of the Invention

The present invention relates to a computer system, a memory structure and a structure for providing storage of data. More specifically, the present invention relates to a computer system, a memory structure and a structure for providing storage of data, in which side-wall memory transistors each including a memory functional unit having the function of retaining a charge or polarization are arranged.

2. Description of the Related Art

Conventionally, a flash memory is typically used as a nonvolatile memory.

In a flash memory, as shown in FIG. 22, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. HEI 5(1993)-304277).

The memory cell retains data according to the more or less a charge amount in the floating gate 902. In a memory cell array constructed by arranging the memory cells, an operation of rewriting/reading a desired memory cell can be performed, by selecting a specific word line and a specific bit line and applying a predetermined voltage.

In such a flash memory, when a charge amount in the floating gate changes, a drain current (Id)-gate voltage (Vg) characteristic as shown in FIG. 23 is displayed. When the amount of negative charges in the floating gate increases, the threshold increases, and an Id-Vg curve shifts almost in parallel in the direction of increasing Vg.

In such a flash memory, however, it is necessary to dispose the insulating film 907 for separating the floating gate 902 from the word line 903 from the functional viewpoint. In addition, it is difficult to reduce the thickness of the gate insulating film in order to prevent leakage of charges from the floating gate 902. It is therefore difficult to effectively reduce the thickness of the insulating film 907 and the gate insulating film, and it disturbs reduction in size of the memory cell.

SUMMARY OF THE INVENTION

The present invention provides a computer system comprising:
(A) a CPU (central processor unit);
(B) a memory arrangement comprising:
(i) a side-wall memory array including a plurality of side-wall memory transistors and sets of bitlines, each side-wall memory transistor having a side-wall portion;
(ii) a charge pump for providing a voltage to accumulate negative charges in the side-wall portion of each side-wall memory transistor during a programming operation;
(iii) a plurality of switching circuits each coupled to the charge pump for receiving the voltage provided by the charge pump and for transferring the voltage to selected sets of the sets of bitlines of the side-wall memory array; and
(iv) logic circuitry for enabling the plurality of switching circuits in a selected sequential order; and
(C) a system bus for transferring data and addresses between the CPU and the memory arrangement,
wherein each of the side-wall memory transistors comprises:
a gate electrode formed on a semiconductor layer with a gate insulating film formed on the semiconductor layer;
a channel region formed below the gate electrode;
a pair of diffusion regions formed on the both sides of the channel region and having a conductive type opposite to that of the channel region; and
a pair of memory functional units formed on the both sides of the gate electrode and having a function of retaining charges.

Also, the present invention also provides a memory structure comprising:
(i) a side-wall memory array including a plurality of side-wall memory transistors and sets of bitlines, each side-wall memory transistor having a side-wall portion;
(ii) a charge pump for providing a voltage to accumulate negative charges in the side-wall portion of each side-wall memory transistor during a programming operation;
(iii) a plurality of switching circuits each coupled to the charge pump for receiving the voltage provided by the charge pump and for transferring the voltage to selected sets of the sets of bitlines of the side-wall memory array; and
(iv) logic circuitry for enabling the plurality of switching circuits in a selected sequential order,
wherein each of the side-wall memory transistors comprises:
a gate electrode formed on a semiconductor layer with a gate insulating film formed on the semiconductor layer;
a channel region formed below the gate electrode;
a pair of diffusion regions formed on the both sides of the channel region and having a conductive type opposite to that of the channel region; and
a pair of memory functional units formed on the both sides of the gate electrode and having a function of retaining charges.

Further, the present invention also provides a computer system comprising:
(A) central processing means;
(B) means for providing storage of data comprising:
(i) side-wall memory array means including a plurality of side-wall memory transistors and sets of bitlines, each side-wall memory transistor having a side-wall portion;
(ii) charge pump means for providing a voltage to accumulate negative charges in the side-wall portion of each side-wall memory transistor during a programming operation;
(iii) a plurality of means for transferring the voltage to selected sets of the sets of bitlines of the side-wall memory array; and (iv) means for enabling the plurality of transferring means in a selected sequential order; and (C) a system bus means for transferring data and addresses between the central processing means and the means for providing storage of data, wherein each of the side-wall memory transistors comprises:

a gate electrode formed on a semiconductor layer with a gate insulating film formed on the semiconductor layer;

a channel region formed below the gate electrode;

a pair of diffusion regions formed on the both sides of the channel region and having a conductive type opposite to that of the channel region; and a pair of memory functional units formed on the both sides of the gate electrode and having a function of retaining charges.

Further, the present invention also provides a structure for providing storage of data, comprising:

(i) side-wall memory array means including a plurality of side-wall memory transistors and sets of bitlines, each side-wall memory transistor having a side-wall portion;

(ii) charge pump means for providing a voltage to accumulate negative charges in the side-wall portion of each side-wall memory transistor during a programming operation;

(iii) a plurality of means for transferring the voltage to selected sets of the sets of bitlines of the side-wall memory array; and (iv) means for enabling the plurality of transferring means in a selected sequential order, wherein each of the side-wall memory transistors comprises:

a gate electrode formed on a semiconductor layer with a gate insulating film formed on the semiconductor layer;

a channel region formed below the gate electrode;

a pair of diffusion regions formed on the both sides of the channel region and having a conductive type opposite to that of the channel region; and a pair of memory functional units formed on the both sides of the gate electrode and having a function of retaining charges.

In the above side-wall memory transistor (hereafter, referred simply to as a SW memory device), a memory function of the memory functional unit is separated from a transistor operation function of the gate insulating film. Accordingly, it is easy to suppress the short channel effect by reducing the thickness of the gate insulating film while retaining the memory function sufficiently. Further, rewriting causes a greater variation in the amount of current flowing between the diffusion regions than in an EEPROM. Therefore, it is easier to distinguish between the writing state and the erasing state in a computer system.

Due to its construction, the SW memory device can be formed by a process which is highly compatible with a normally semiconductor forming process. Therefore, forming the SW memory device together with a transistor allows the number of masks and the number of processes to be dramatically reduced as compared with the case where a conventional flash memory is formed together with a transistor. As a result, the yields of chips on which the SW memory device and a CPU are formed together can be improved. Consequently, manufacturing costs can be reduced, and an inexpensive computer system with a high reliability can be obtained.

Still further, the present invention provides a display device and a portable electronic apparatus in which the above mentioned computer system is incorporated.

According to the present invention, there are provided display devices having uniform picture quality if the computer system of the present invention is used for storing information for correcting display variations after manufacture of a display panel. Moreover, since the SW memory device can be formed together with a logic circuit by a simple process, the display device and the portable electronic apparatus of the present invention can be manufactured at a suppressed cost. Also, the display device and the portable electronic apparatus of the present invention can be operated at an improved speed due to their high-speed reading operations. Thus, the present invention provides a display device and a portable electronic apparatus which are inexpensive and have high performance.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
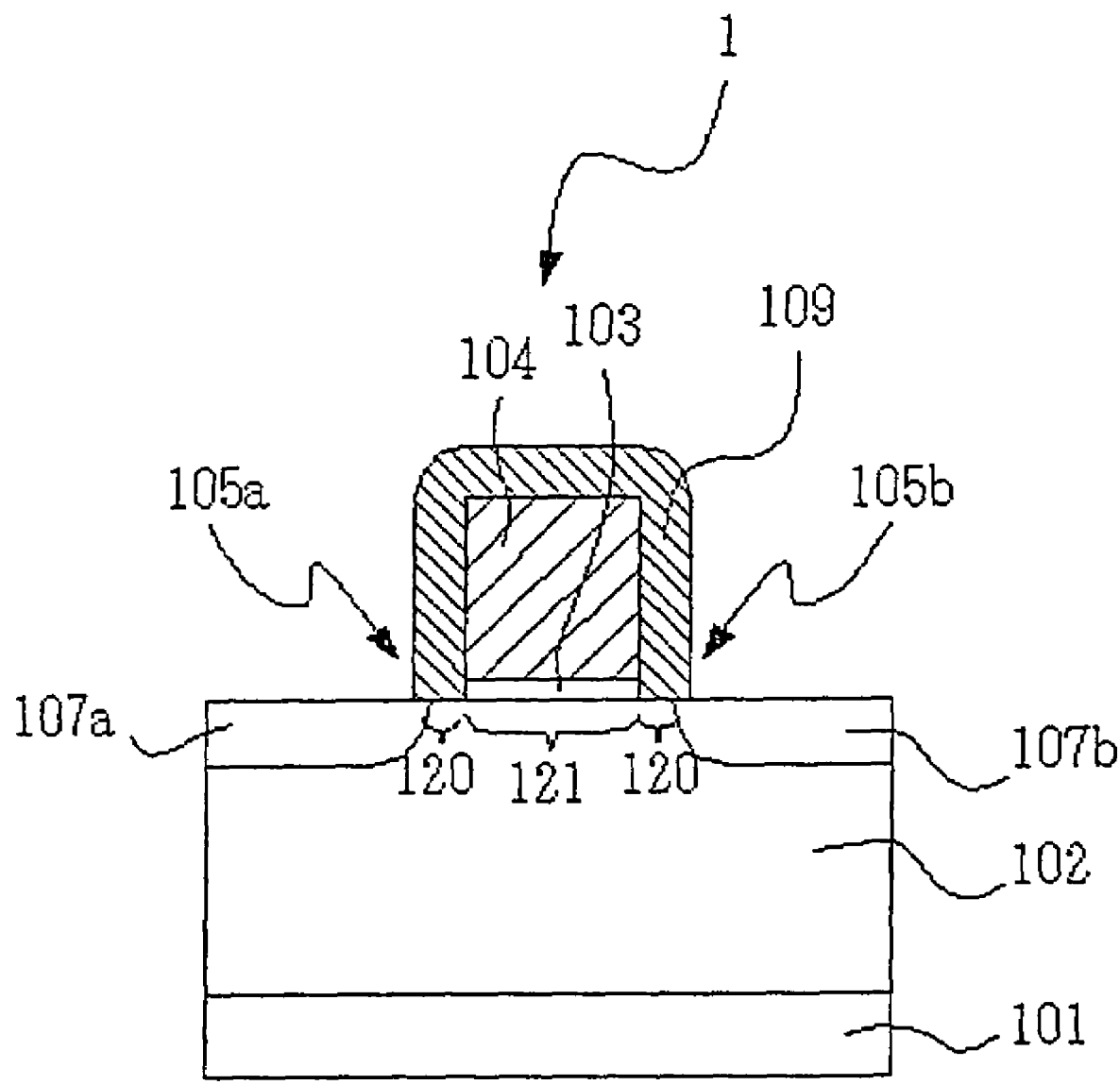
FIG. 1 is a schematic sectional view of a principal portion of a memory cell constituted a semiconductor memory device of the present invention (First Embodiment)

A SW memory cell used in the present invention is mainly constructed by a semiconductor layer, a gate insulating film, a gate electrode, a channel region, a diffusion region and a memory functional unit. Herein, the channel region is normally a region of the same conductive type as that of the semiconductor layer and denotes a region below the gate electrode. The diffusion region denotes a region of the conductive type opposite to that of the channel region.

Concretely, the SW memory cell of the present invention may be constructed by a region of a first conductive type as the diffusion region, a region of a second conductive type as the channel region, the memory functional unit disposed across a border of the regions of the first and second conductive types, and an electrode provided via the gate insulating film or a insulating film. It is suitable that the memory cell of the present invention is constructed by the gate electrode formed on the gate insulating film, two memory functional units formed on both sides of the gate electrode, two diffusion regions disposed on the opposite sides of the gate electrode of the memory functional units, and a channel region disposed below the gate electrode.

In the SW memory cell of the present invention, the semiconductor layer is formed on the semiconductor substrate as the semiconductor layer, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS (Silicon on Sapphire) substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although the more or less of an amount of current flowing therein varies.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration which is within a known range in this field can be used as impurity concentration in the semiconductor layer and the well region. In the case of using the SOI substrate as the semiconductor layer, the well region may be formed in the surface semiconductor layer and a body region may be provided below the channel region.

The gate insulating film or the insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode or the electrode is formed in a shape which is usually used for a semiconductor device or a shape having a recess in a lower end portion on the gate insulating film. The gate electrode is preferably formed in an integral form. The gate electrode formed in the integral form means that the gate electrode comprised a single-layered or multilayer conductive film is not separated and formed in an integral form. The gate electrode may have a side-wall insulating film on its sidewalls. Usually, the gate electrode is not particularly limited as long as it is used for a semiconductor device, and examples of thereof includes a conductive film, for example, a single-layered or multilayer film made of polysilicon, a metal such as copper or aluminum, a high-refractory metal such as tungsten, titanium or tantalum, and a silicide with the high refractory metal. Suitable thickness of the gate electrode is, for example, about 50 to 400 nm. Below the gate electrode, a channel region is formed.

Preferably, the gate electrode is formed only on the sidewalls of the memory functional unit as described later or does not cover the top part of the memory functional unit. By such arrangement, a contact plug can be disposed closer to the gate electrode, so that reduction in the size of the SW memory cell is facilitated. It is easy to manufacture the SW memory cell having such simple arrangement, so that the yield in production can be improved.

In other words, the memory functional unit contains a film (hereinafter, described as "charge retaining function film") or a region had the function of retaining charges, the function of accumulating and retaining charges, the function of trapping charges or the function of holding a charge polarization state. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of SW memory cells, even when the distance between the SW memory cells is shortened and neighboring memory functional units come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the SW memory cell is facilitated.

The film having the charge retaining function does not always have to have a film shape in order to increase the reliability of storage and retention. Preferably, films having the charge retaining function exist discretely in an insulating film. Concretely, it is preferable that the materials having the charge retaining function in the shape of dots be spread in a material which is hard to retain charges, for example, in a silicon oxide.

In the case of using a conductive film or semiconductor layer as the charge retaining film, preferably, the conductive film is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction, preferably, difference between impurity concentrations of the diffusion regions and the semiconductor layer or well region is high for the reason that hot electrons or hot holes are generated efficiently with low voltage, and high-speed operation can be performed with lower voltage. The junction depth of the diffusion regions is not particularly limited but can be appropriately adjusted in accordance with the performance or the like of a semiconductor memory device to be obtained. In the case of using an SOI substrate as a semiconductor substrate, the diffusion regions may have a junction depth smaller than the thickness of the surface semiconductor layer. It is preferable that the diffusion regions have junction depth almost the same as that of the surface semiconductor layer.

The diffusion regions may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion regions closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the source/drain regions. This is because the essence of the SW memory cell as a component of the semiconductor memory device is to rewrite stored information by an electric field which is applied across the memory functional unit in accordance with the voltage difference between the gate electrode which exists only in the sidewall part of the memory functional unit and the source/drain regions.

A part of the diffusion regions may extend at a level higher than the surface of the channel region or the under face of the gate insulating film. In this case, it is suitable that, on the diffusion regions formed in the semiconductor substrate, the conductive film integrated with the diffusion regions are laminated. The conductive film may be made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion regions in the semiconductor layer shallow and to suppress the short channel effect. In this case, preferably, a part of the diffusion regions are disposed so as to sandwich at least a part of the memory functional unit in cooperation with the gate electrode.

The SW memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode or the electrode, after that, forming a single-layer film or laminated film including the charge retaining film such as a charge retaining film, charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode or the electrode is formed, charge retaining film, charge retaining film/insulating film, insulating film/charge retaining film, insulating film/charge retaining film/insulating film, or the like is formed. An opening is formed in a region which becomes the channel region of these films, a gate electrode material film is formed on the entire surface of the opening, and the gate electrode material film is patterned in a shape including the opening and larger than the opening, thereby forming the gate electrode and the memory functional unit.

There will be explained one example of a method for forming the SW memory device of the present invention. First, a gate insulating film and a gate electrode are formed on a semiconductor substrate by a known procedure. Next, on the entire surface of the semiconductor substrate, a silicon oxide film with a thickness of 0.8 to 20 nm, more preferably 3 to 10 nm, is formed by thermal oxidation or deposited by CVD (Chemical Vapor Deposition). Then, a silicon nitride film with a thickness of 2 to 15 nm, more preferably 3 to 10 nm, is deposited by CVD on the entire surface of the silicon oxide film. In turn, a silicon oxide film with a thickness of 20 to 70 nm is deposited on the entire surface of the silicon nitride film.

Subsequently, the silicon oxide film/silicon nitride film/silicon oxide film is etched back by anisotropic etching, so that memory functional units, most suitable for storage, are provided in the form of memory device side-wall spacers on the side walls of the gate electrode.

Then, diffusion regions (source/drain regions) are formed by ion injection using as masks the gate electrode and the memory functional units in the form of memory device side-wall spacers. Thereafter, a silicidation process and an upper-wiring installation process are carried by a known procedure to provide a SW memory device.

In the case of constructing the memory cell array by arranging SW memory cells of the present invention, the best mode of the memory cell satisfies all of the requirements: for example, (1) the gate electrodes of a plurality of SW memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the region having the function of retaining charge (example, region having the silicon nitride film) and a diffusion region in the memory functional unit are overlapped; (7) the thickness of the insulating film separating the silicon nitride film having the surface which is almost parallel with the surface of the gate insulating film from the channel region or semiconductor layer and the thickness of the gate insulating film are different from each other; (8) an operation of writing/erasing one SW memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. It may be sufficient for the memory cell to satisfy even one of the requirements.

In the case where the memory cell satisfies the requirements (3) and (9), it is very useful for the following reasons. First, the bit line contact can be disposed closer to the memory functional unit on the word line sidewall or even when the distance between SW memory cells is shortened, a plurality of memory functional units do not interfere with each other, and stored information can be held. Therefore, reduction in size of the SW memory cell is facilitated. In the case where the charge retaining region in the memory functional unit is made of a conductor, as the distance between SW memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo and etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo and etching process for isolating the memory functional unit for each memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) is satisfied.

Specifically, writing and erasing can be performed with a very low voltage by overlapping the charge retaining region in the memory functional unit and the diffusion region. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed at high speed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed at high speed.

In short, in the case where the requirement (3) or (9) is not satisfied, even when the requirement (6) is not satisfied, writing operation can be performed at high speed. Not satisfying the requirement (3) or (9), however, causes increase in the occupation area of a memory cell. As clear from the above, it is preferable to satisfy the requirements (3), (6) and (9) at the same time.

In the SW memory cell of the present invention, a transistor may be connected in series with one of or both sides of the SW memory cell, or the SW memory cell may be mounted on the same chip with a logic transistor. In such a case, the semiconductor device of the present invention, particularly, the SW memory cell can be formed by a process having high compatibility with a process of forming a normal standard transistor such as a transistor or a logic transistor, they can be formed simultaneously. Therefore, a process of forming both the SW memory cell and a transistor or a logic transistor is very simple and, as a result, a cheap embedded device can be obtained.

In the SW memory cell of the present invention, the SW memory cell can store information of two or more values in one memory functional unit. Thus, the SW memory cell can function as a memory cell for storing information of four or more values. The SW memory cell may store binary data only. The SW memory cell is also allowed to function as a memory cell having the functions of both a selection transistor and a memory transistor by a variable resistance effect of the memory functional unit.

The SW memory cell of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multiprocessor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of the present invention may be provided as at least a part of a control circuit or a data storing circuit of an electronic device or, as necessary, detachably assembled.

Hereinafter, embodiments of the semiconductor memory device, the display device and the portable electronic apparatus of the present invention will be described in detail with reference to the drawings.

First Embodiment

A semiconductor memory device of a first embodiment has a SW memory cell 1 as shown in FIG. 1.

The SW memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
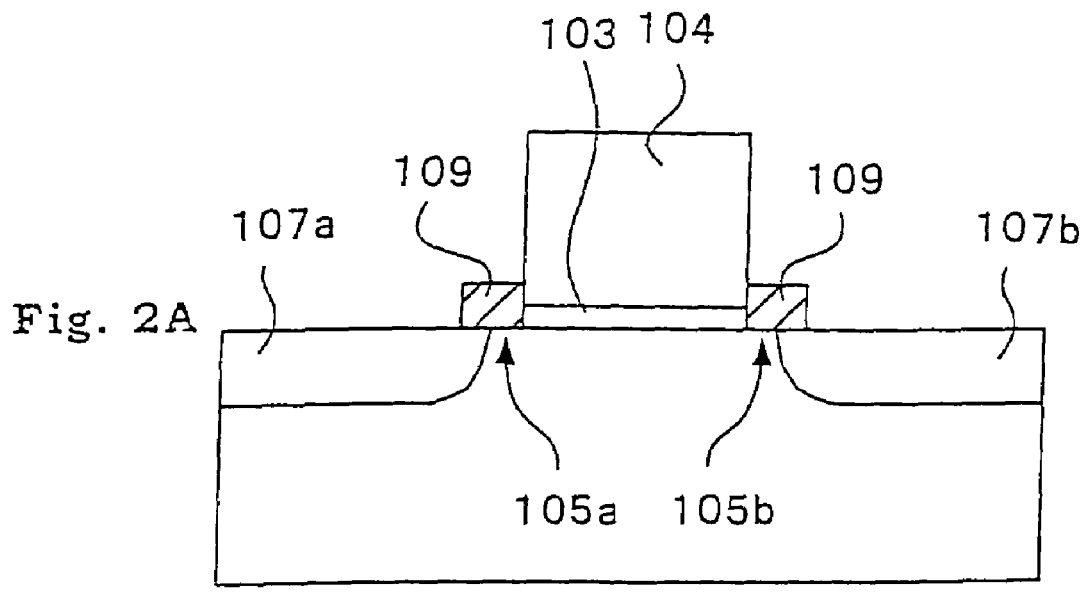
FIGS. 2A and 2B are schematic sectional views of principal portions of another memory cells constituted semiconductor memory devices of the present invention (First Embodiment)
Figure 2B:
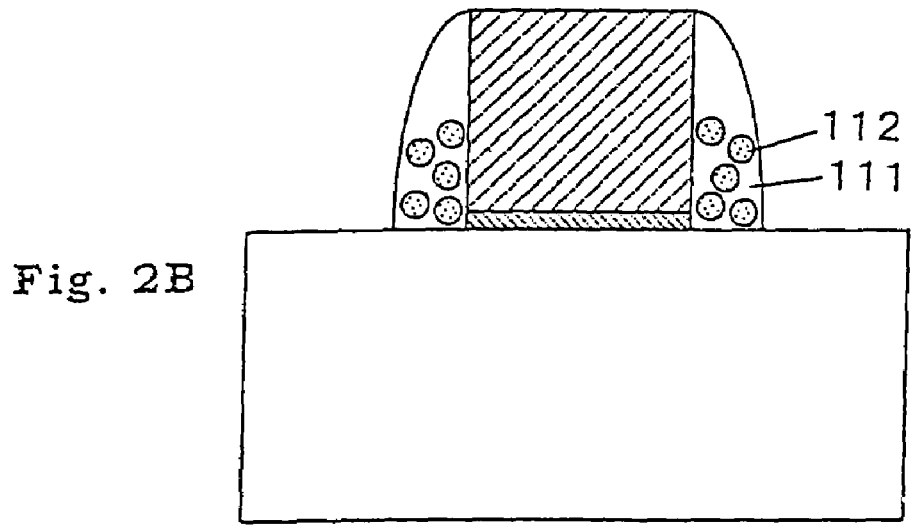

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go (tunnel) to the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the SW memory cell will be described with reference to FIGS. 3 and 4. The case where whole memory functional units 131a and 131b have the function of retaining charges will be described.

"Writing" denotes herein injection of electrons into the memory functional units 131a and 131b when the SW memory cell is of the N channel type. Hereinafter, on assumption that the SW memory cell is of the N channel type, description will be given.

Figure 3:
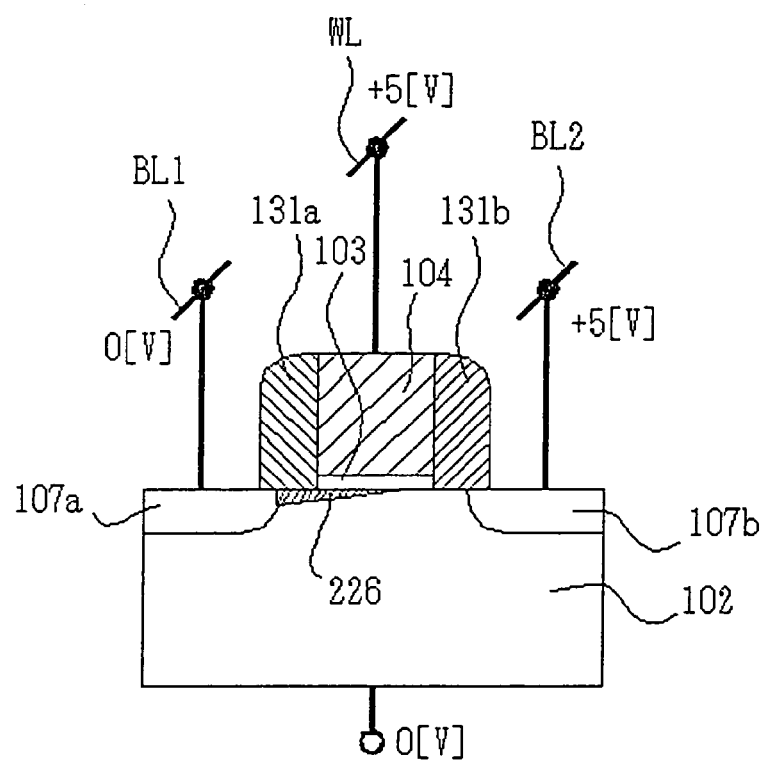
FIGS. 3 and 4 are views for illustrating writing operations of memory cells constituted semiconductor memory devices of the present invention (First Embodiment)

As shown in FIG. 3, the first diffusion region 107a of the N type is set as a source electrode, and the second diffusion region 107b of the N type is set as a drain electrode, in order to inject electrons (write) the second memory functional unit 131b. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). Writing is performed by injection of the hot electrons into the second memory functional unit 131b. Since hot electrons are not generated in the vicinity of the first memory functional unit 131a, writing is not performed.

As aforesaid, by injecting electrons into the second memory functional unit 131b, writing is performed.

Figure 4:
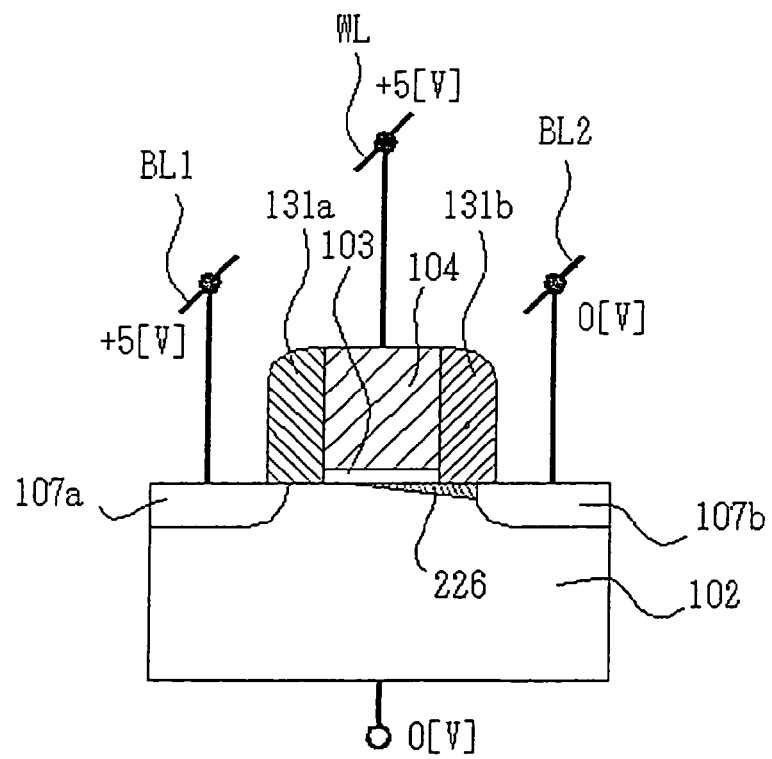

On the other hand, as shown in FIG. 4, the second diffusion region 107a is set as the source electrode, and the first diffusion region 107a is set as the drain electrode, in order to inject electrons (write) into the first memory functional unit 131a. For example, 0 V is applied to the second diffusion region 107b and the P-type well region 102, +5 V is applied to the first diffusion region 107a, and +5 V is applied to the gate electrode 104. Electrons are injected into the first memory functional unit 131a and writing can be performed by interchanging the source and drain regions so as to be different from the case of injecting electrons into the second memory functional unit 131b.

The principle of erasing operation of the SW memory cell will now be described with reference to FIGS. 5 and 6.

Figure 5:
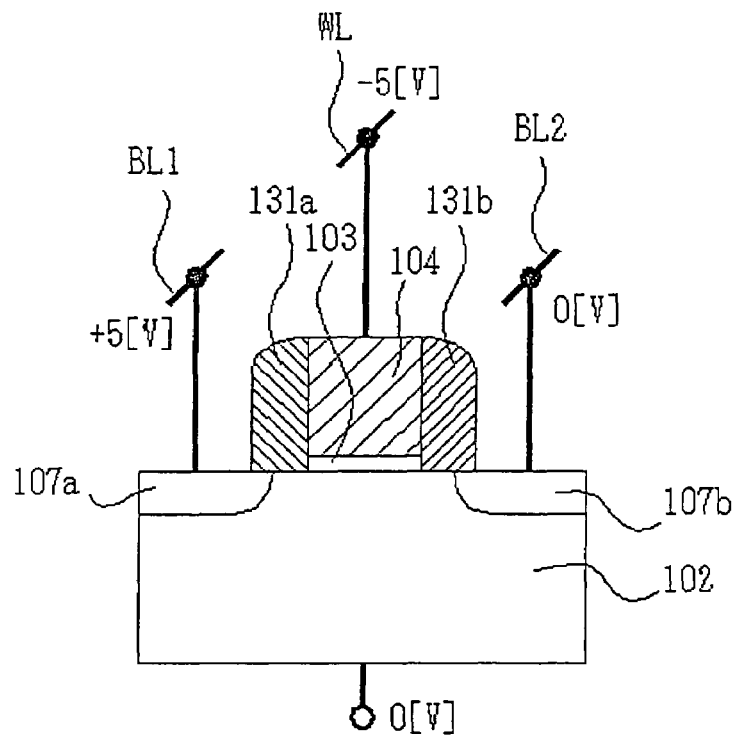
FIGS. 5 and 6 are views for illustrating erasing operations of memory cells constituted semiconductor memory devices of the present invention (First Embodiment)

In a first method of erasing information stored in the first memory functional unit 131a, the PN junction between the first diffusion region 107a and the P-type well region 102 is reverse-biased and, further, negative voltage (for example, −5V) is applied to the gate electrode 104, by applying positive voltage (for example, +5 V) to the first diffusion region 107a and applying 0 V to the P-type well region 102 as shown in FIG. 5. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
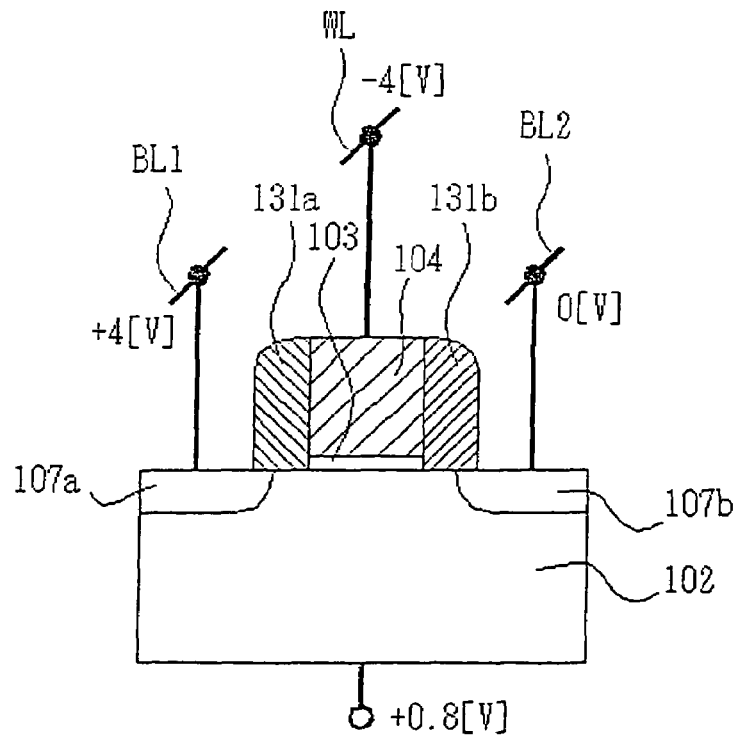

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, electrons injected in the P-type well region 102 become a trigger, and hot holes are generated in the PN junction positioned on the opposite side by applying forward voltage between the P-type well region 102 and the second diffusion region 107b. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the SW memory cell due to hot carriers can be suppressed.

In any of the erasing methods, over-erasure does not occur easily in the SW memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the SW memory cell of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Further, the principle of reading operation of the SW memory cell will be described with reference to FIG. 7.

Figure 7:
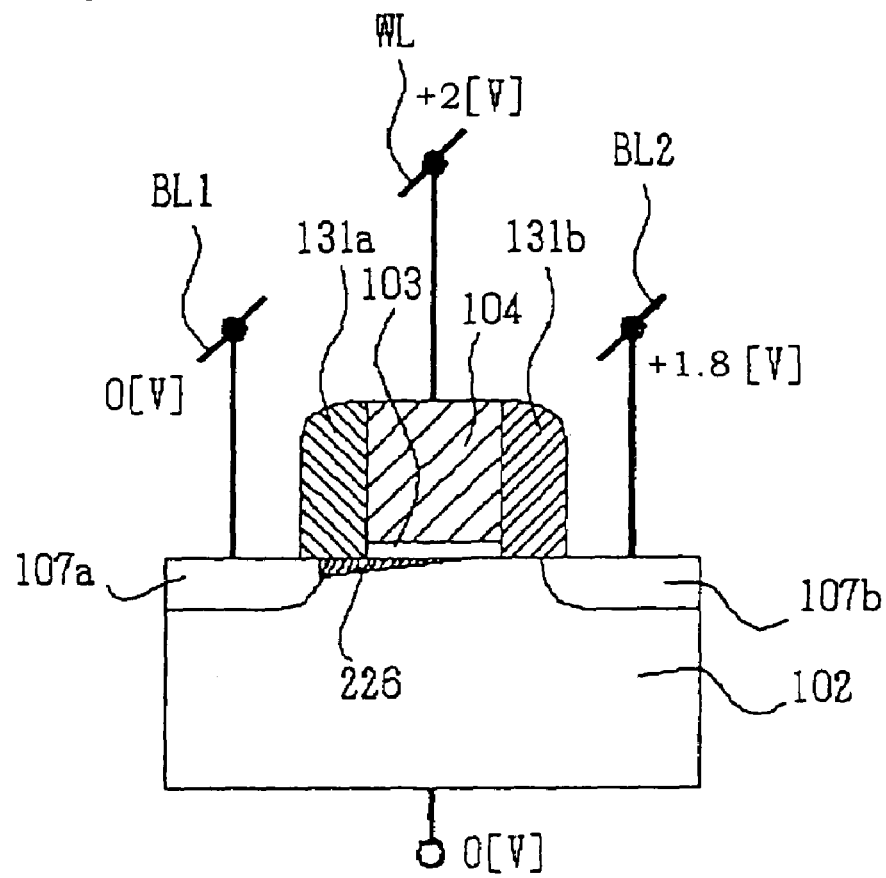
FIG. 7 is a view for illustrating a reading operation of a memory cell constituted a semiconductor memory device of the present invention (First Embodiment)

In the case of reading information stored in the first memory functional unit 131a as shown in FIG. 7, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a, and +2 V to the gate electrode 104. Information stored in the second memory functional unit 131b can be read by interchanging the source and drain regions of the case of reading information stored in the first memory functional unit 131a.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. A memory cell array can be constructed by connecting a word line WL to the gate electrode 104 of the SW memory cell, connecting a first bit line BL1 to the first diffusion region 107a, connecting a second bit line BL2 to the second diffusion region 107b, and arranging SW memory cells.

In the above-described operating method, writing and erasing of two bits per one transistor are performed by interchanging the source electrode and the drain electrode. Alternately, the transistor may operate as a 1-bit memory by fixing the source electrode and the drain electrode. In this case, common fixed voltage can be applied to one of the source and drain regions, so that the number of bit lines connected to the source/drain regions can be reduced to the half.

As obvious from the above description, in the SW memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the SW memory cell and, accordingly, the semiconductor memory device can be achieved easily.

Second Embodiment

Figure 8:
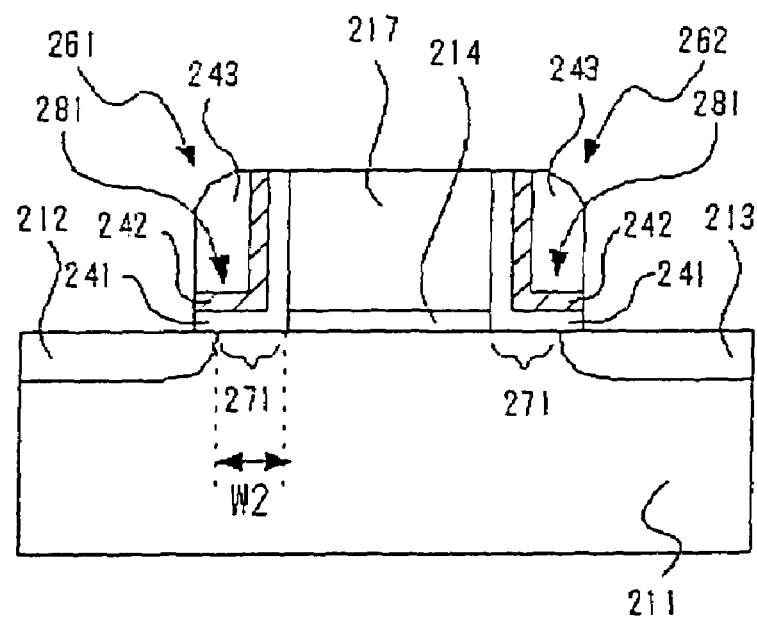
FIG. 8 is a schematic sectional view of a principal portion of a memory cell constituted a semiconductor memory device of the present invention (Second Embodiment)

A SW memory cell according to a second embodiment has a configuration substantially similar to that of the SW memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film. Further, charge injecting efficiency at the time of rewriting operation becomes high by employing the structure in which the silicon nitride film 242 is sandwiched by the silicon oxide films 241 and 243, so that higher-speed operation can be performed. In the SW memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
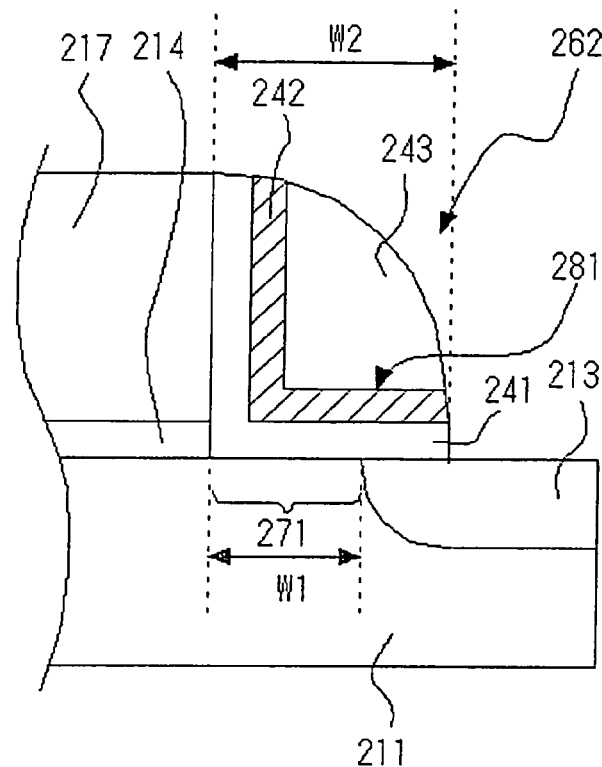
FIG. 9 is a schematic enlarged sectional view of a principal portion of a memory cell in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
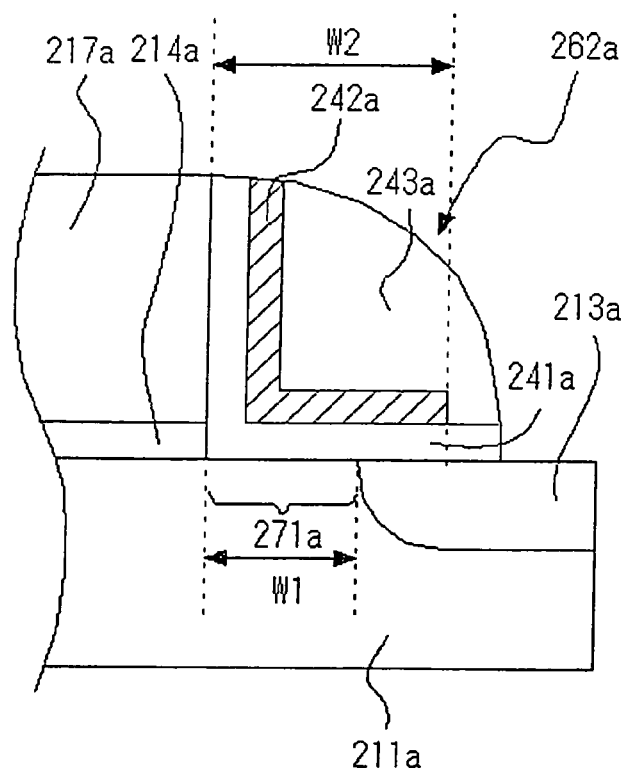
FIG. 10 is a schematic enlarged sectional view of a principal portion of another cell deformed memory cell in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
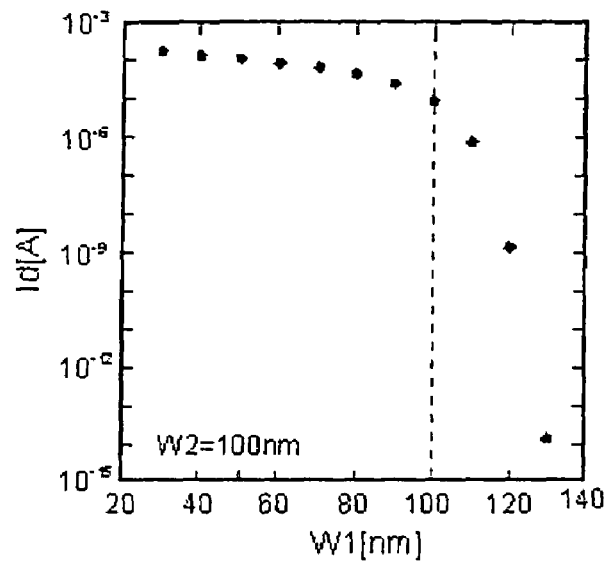
FIG. 11 is a diagram showing an electric characteristic of a memory cell constituted a semiconductor memory device of the present invention (Second Embodiment)

FIG. 11 shows drain current Id when the width W2 of the memory functional unit 262 is fixed to 100 nm and the offset amount W1 is changed in the structure of the SW memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, memory cell arrays were produced by fixing W2 to 100 nm and setting W1 to 60 nm and 100 nm as design values. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 nsec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film.

Figure 12:
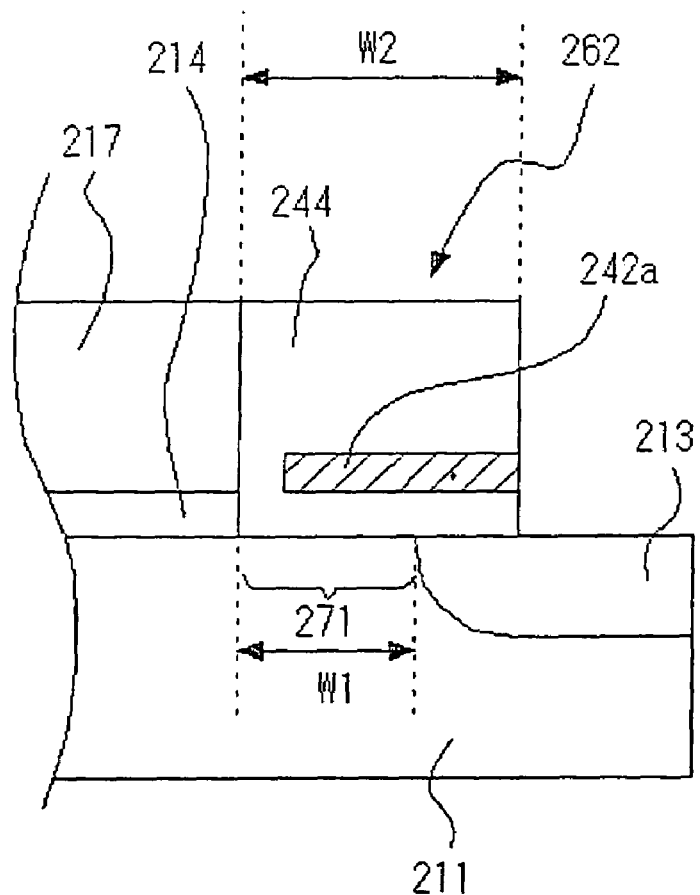
FIG. 12 is a schematic sectional view of a principal portion of another memory cell constituted a semiconductor memory device of the present invention (Second Embodiment)

The memory functional unit preferably includes the charge retaining film disposed almost in parallel with the gate insulating film surface. In other words, it is preferable that the level of the top face of the charge retaining film in the memory functional unit is positioned parallel to the level of the top face of the gate insulating film. Concretely, as shown in FIG. 12, the silicon nitride film 242a as a charge retaining film of the memory functional unit 262 has a surface almost parallel with the surface of the gate insulating film 214. In other words, it is preferable that the silicon nitride film 242a is formed at a level parallel to the level corresponding to the surface of the gate insulating film 214.

Formation easiness of the inversion layer in the offset region 271 can be effectively controlled in accordance with the more or less of an amount of charges accumulated in the silicon nitride film 242a by the existence of the silicon nitride film 242a almost parallel to the surface of the gate insulating film 214 in the memory functional unit 262. Thus, the memory effect can be increased. Even in the case where the offset amount (W1) varies, a change in the memory effect can be maintained relatively small, and variations of the memory effect can be suppressed, by forming the silicon nitride film 242a almost in parallel with the surface of the gate insulating film 214. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a SW memory cell having a better retention characteristic can be obtained.

The distance from the surface of the semiconductor substrate to charges accumulated in the charge retaining film can be maintained almost constant by controlling the thickness of the silicon nitride film 242a and controlling the thickness of the insulating film below the silicon nitride film 242a (portion on the offset region 271 in the silicon oxide film 244) to be constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the SW memory cell can be reduced very much.

Third Embodiment

Figure 13:
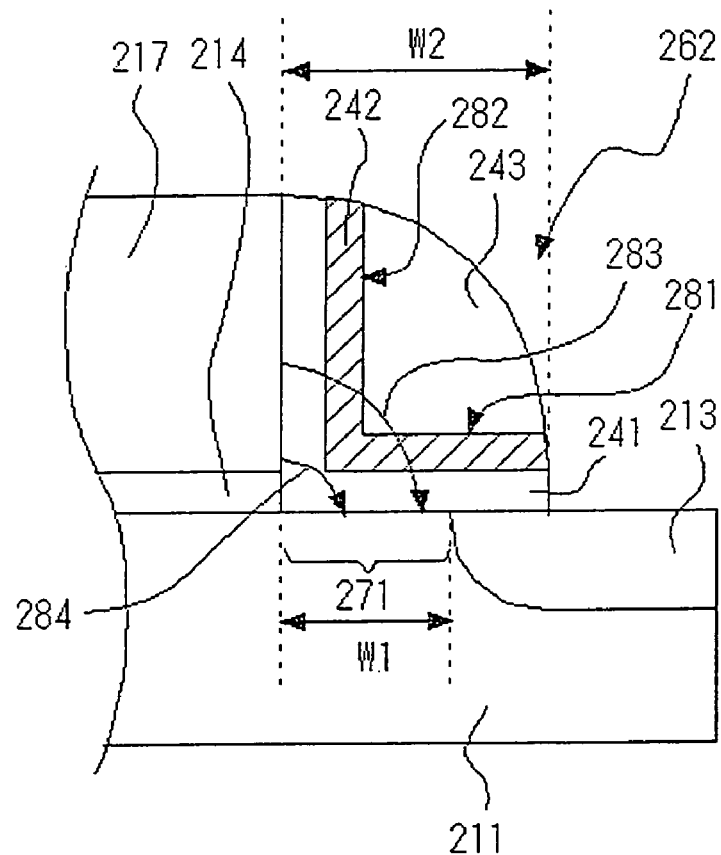
FIG. 13 is a schematic sectional view of a principal portion of a memory cell constituted a semiconductor memory device of the present invention (Third Embodiment)

The memory functional unit 262 in a semiconductor memory device of a third embodiment has a shape in which the silicon nitride film 242 as a charge retaining film has almost uniform thickness and is disposed almost in parallel with the surface of the gate insulating film 214 as shown in FIG. 13 (region 281) and, further, almost in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, charges injected into the memory functional unit 262 increase in the rewriting operation, and the rewriting speed increases, by including the charge retaining film shown by the arrow 282.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film almost parallel to the surface of the gate insulating film from the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and accordingly prevents a change in the electric characteristics. Thus, the reliability of the SW memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be almost controlled, and charge leak can be prevented.

Fourth Embodiment

In a fourth embodiment, optimization of the gate electrode, the memory functional unit, and the distance between the source and drain regions of a SW memory cell will be described.

Figure 14:
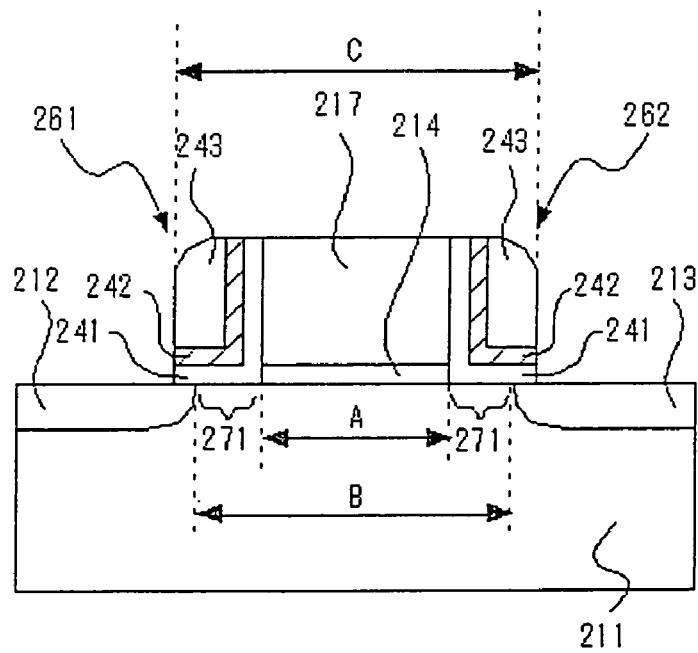
FIG. 14 is a schematic sectional view of a principal portion of a memory cell constituted a semiconductor memory device of the present invention (Forth Embodiment)

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a SW memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
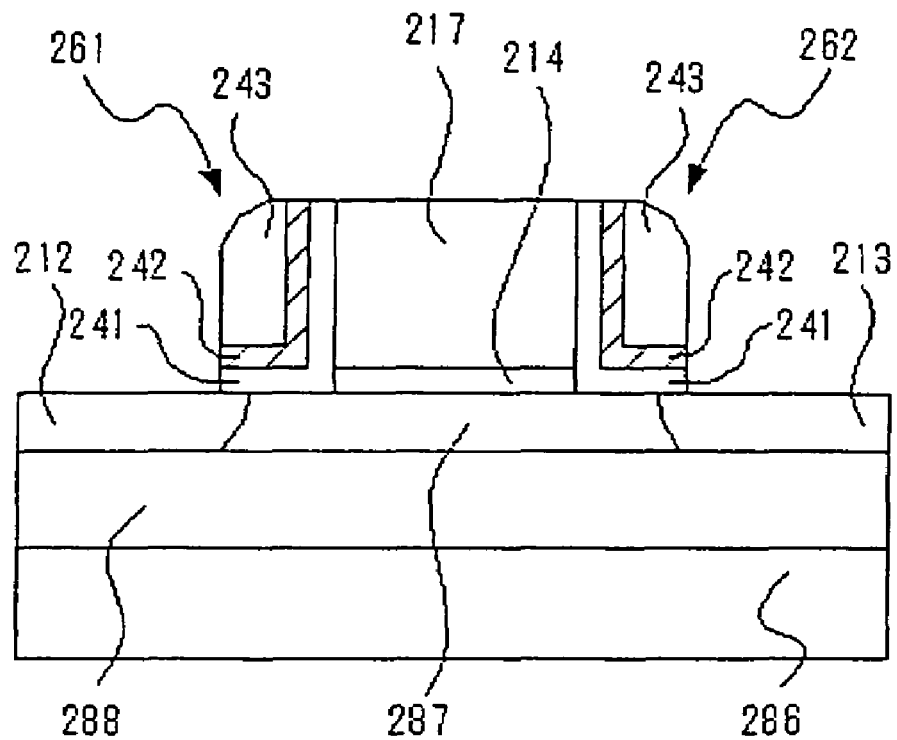
FIG. 15 is a schematic sectional view of a principal portion of a memory cell constituted a semiconductor memory device of the present invention (Fifth Embodiment)

A SW memory cell in a fifth embodiment has a substantially similar configuration to that of the second embodiment except that an SOI substrate is used as the semiconductor substrate in the second embodiment as shown in FIG. 15.

In the SW memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the SW memory cell as well, action and effect similar to those of the SW memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
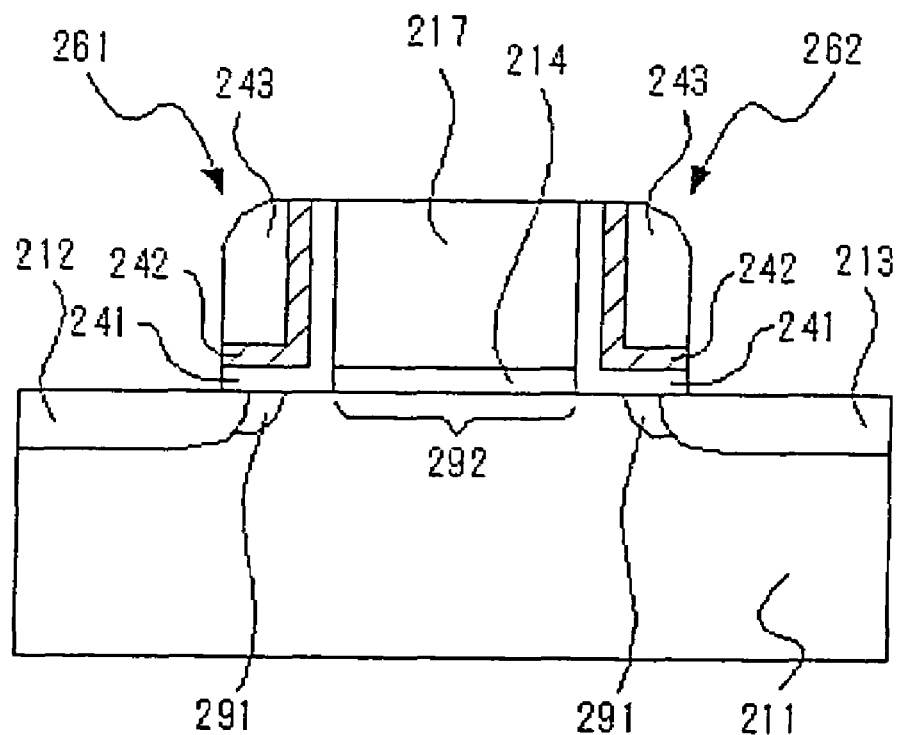
FIG. 16 is a schematic sectional view of a principal portion of a memory cell constituted a semiconductor memory device of the present invention (Sixth Embodiment)

A SW memory cell in a sixth embodiment has, as shown in FIG. 16, a configuration substantially similar to that of the SW memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the SW memory cell with low rewriting voltage or high rewriting speed and high reading speed can be obtained.

In FIG. 16, the threshold of the whole transistor remarkably increases, by providing the P-type high-concentration region 291 in the vicinity of the source/drain regions and below the memory functional unit (that is, not immediately below the gate electrode). The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, only the threshold in the writing operation largely fluctuates, and the memory effect (the difference between the threshold in the writing operation and that in the erasing operation) can be remarkably increased, by disposing the P-type high-concentration region 291 under the memory functional unit and in the vicinity of the source/drain regions.

Seventh Embodiment

Figure 17:
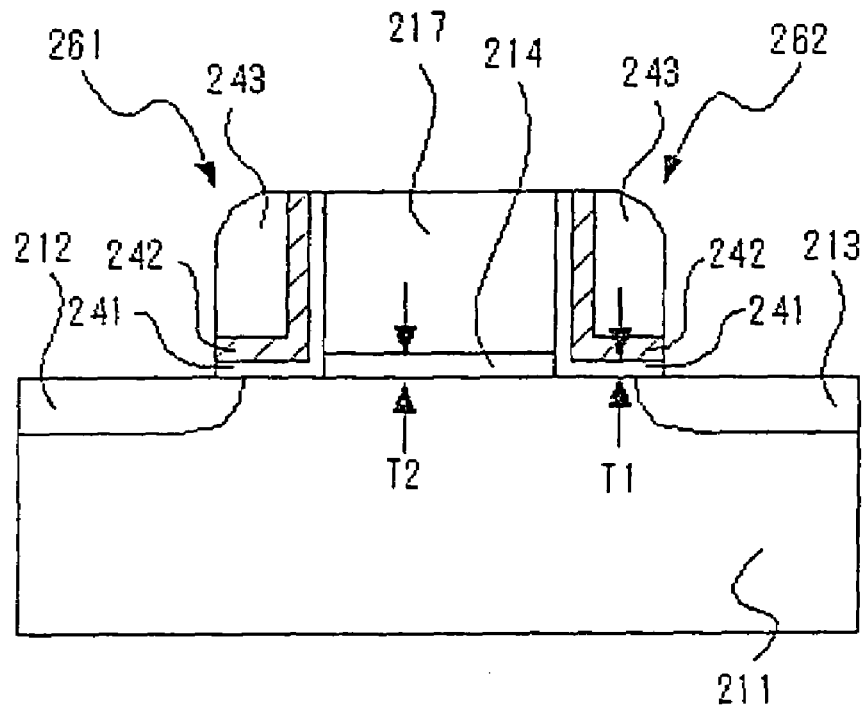
FIG. 17 is a schematic sectional view of a principal portion of a memory cell constituted a semiconductor memory device of the present invention (Seventh Embodiment)

A SW memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) from the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the SW memory cell for the following reason.

In the SW memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

Figure 23:
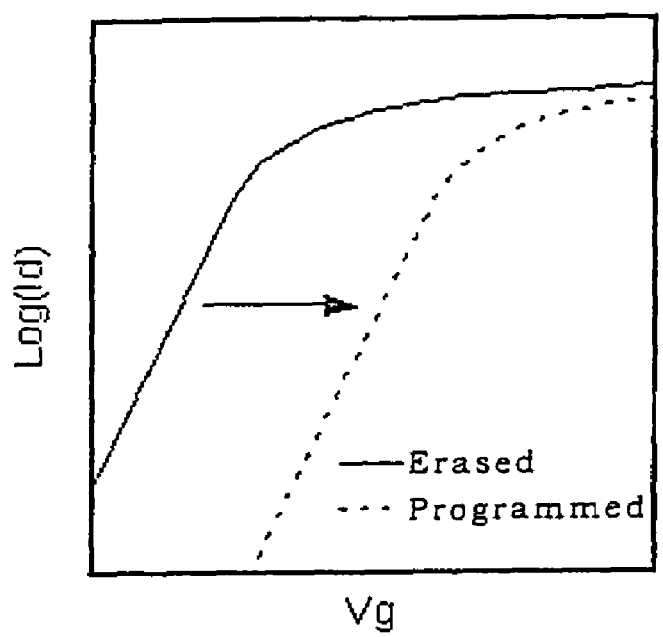
FIG. 23 is a diagram showing an electric characteristic of a flash memory of the prior art.

The electric lines of force in the memory functional unit include a short one which does not pass through the silicon nitride film 242 as shown by an arrow 284 in FIG. 23. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) from the channel region or well region, so that a high electric field from the gate electrode directly acts. Therefore, in an EEPROM, the thickness of the insulating film separating the floating gate from the channel region or well region is regulated, and optimization of the function of the SW memory cell is inhibited. As clear from the above, an essential reason for increasing the flexibility of T1 is that the insulating film separating the charge retaining film and the channel region or well region is not sandwiched between the gate electrode and the channel region or well region.

As obvious from the above, by setting T1<T2, without deteriorating the withstand voltage performance of the memory, the voltage of the writing and erasing operations is decreased, or the writing operation and erasing operation are performed at high speed and, further, the memory effect can be increased.

More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a large design rule, to drive the liquid crystal panel TFT, voltage of 15 to 18 V at the maximum is required normally, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) from the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
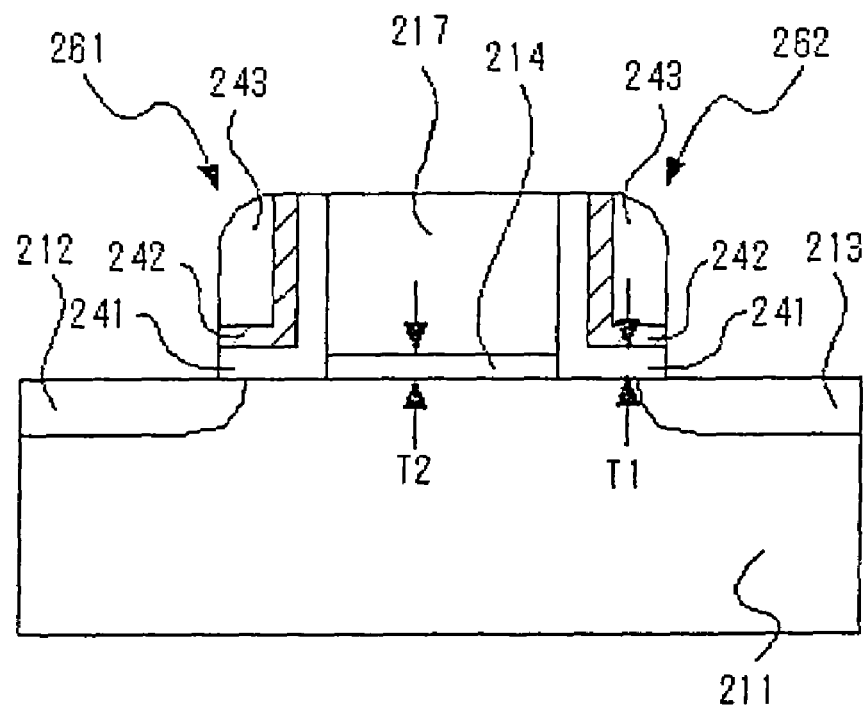
FIG. 18 is a schematic sectional view of a principal portion of a memory cell constituted a semiconductor memory device of the present invention (Eighth Embodiment)

A SW memory cell of an eighth embodiment has a configuration substantially similar to that of the second embodiment except that, as shown in FIG. 18, the thickness (T1) of the insulating film separating the charge retaining film (silicon nitride film 242) from the channel region or well region is larger than the thickness (T2) of the gate insulating film.

The thickness T2 of the gate insulating film 214 has an upper limit value due to demand of preventing a short channel effect of the cell. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) from the channel region or well region can be designed optimally independent of the gate insulating film thickness. Thus, an effect that the memory functional unit does not disturb scaling is obtained.

The reason why flexibility of designing T1 is high in the SW memory cell is that, as described already, the insulating film separating the charge retaining film from the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the SW memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film from the channel region or well region, but only a relatively low electric field which spreads in the horizontal direction from the gate electrode acts. Consequently, the SW memory cell having a gate length which is reduced to be equal to or less than the gate length of a logic transistor of the same process generation can be realized.

Ninth Embodiment

Figure 19:
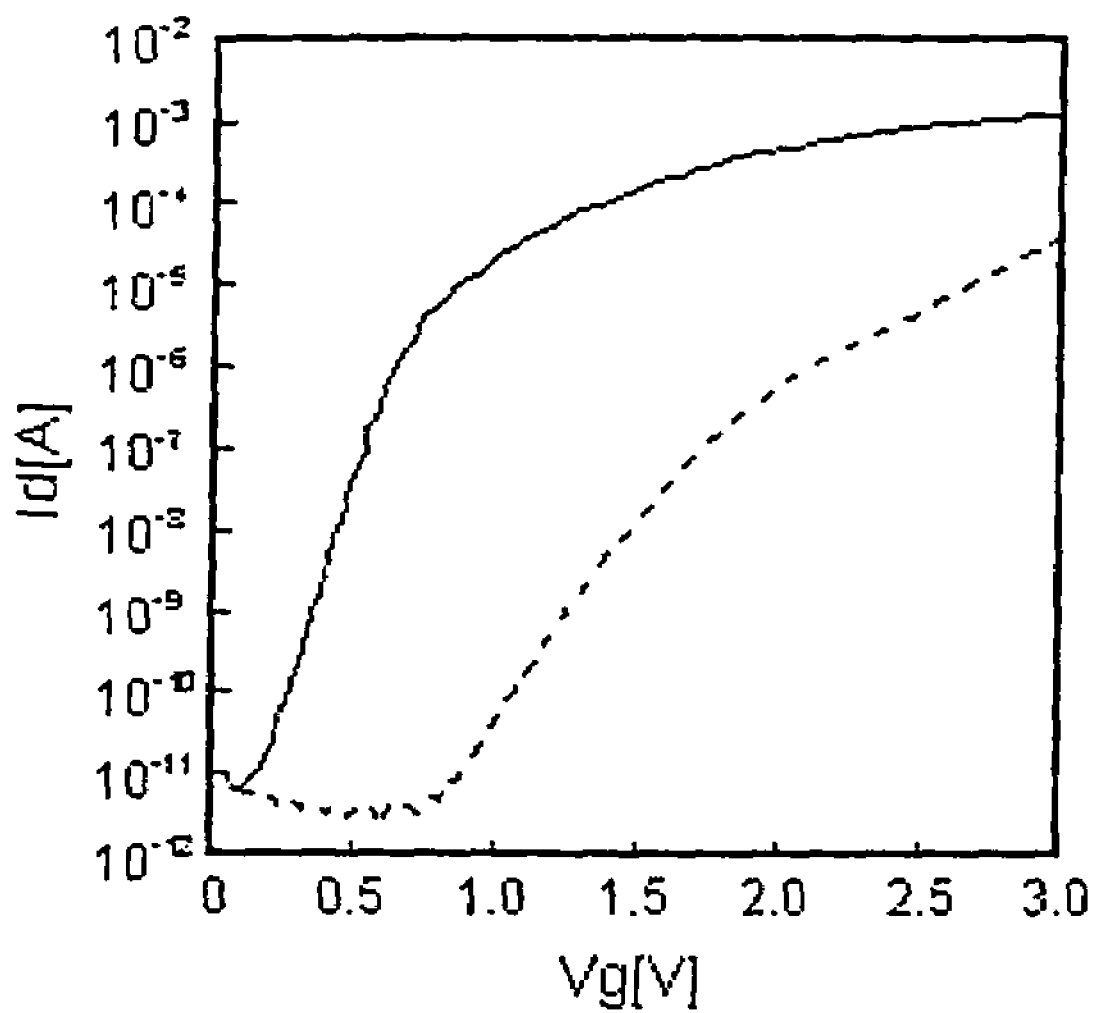
FIG. 19 is a schematic sectional view of a principal portion of a memory cell constituted a semiconductor memory device of the present invention (Ninth Embodiment)

A ninth embodiment relates to a change in the electric characteristic at the time of rewriting a SW memory cell in an N-channel type SW memory cell, when an amount of charges in a memory functional unit changes, a drain current (Id)-gate voltage (Vg) characteristic (actual measurement value) as shown in FIG. 19 is exhibited.

Figure 27:
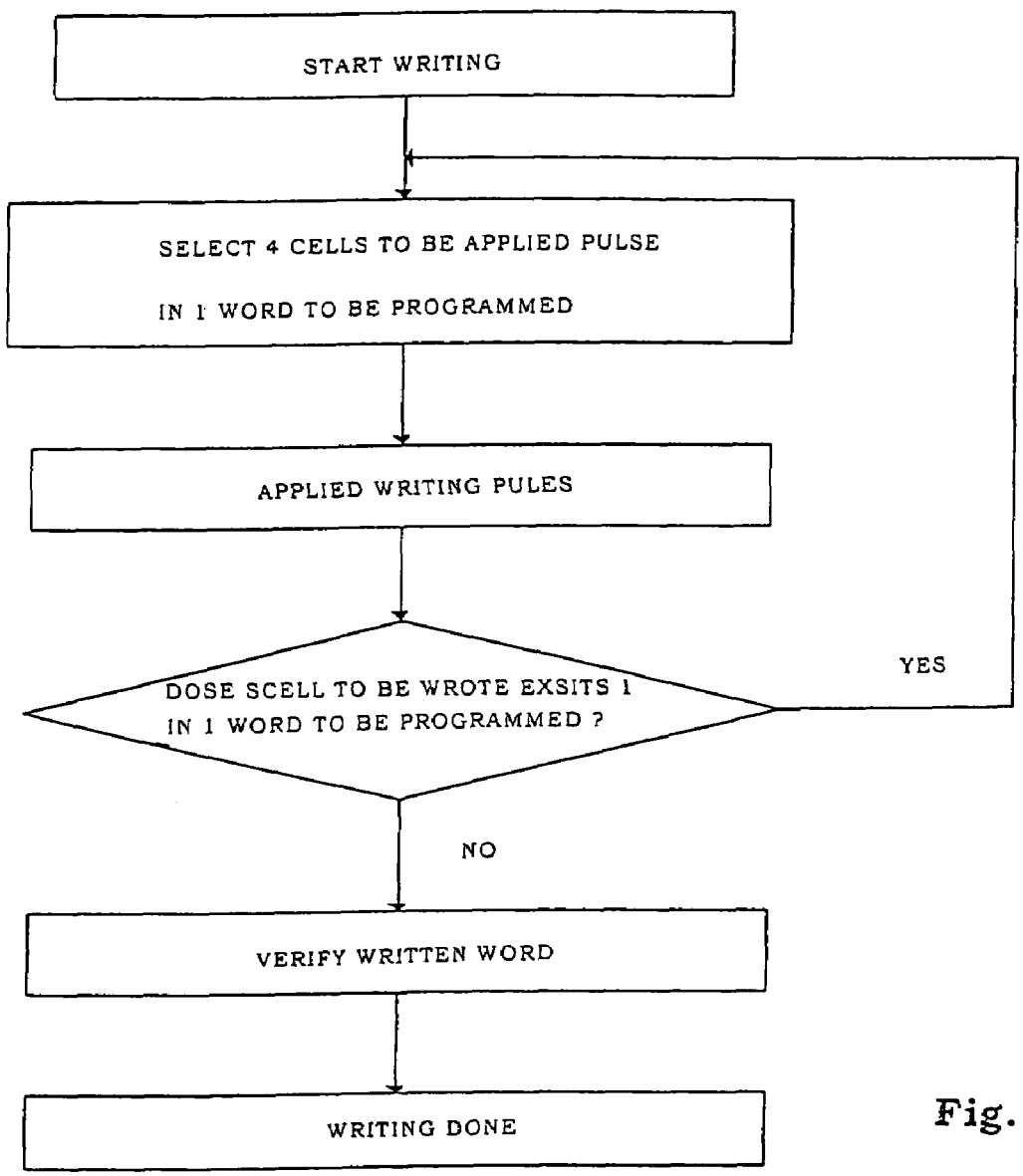
FIG. 27 is a flow chart for explaining a programming method according to the present invention (Tenth Embodiment).

As obvious from FIG. 19, in the case of performing a writing operation from an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 27).

Appearance of such a characteristic is a peculiar phenomenon which occurs since the gate electrode and the diffusion region are offset from each other, and the gate electric field does not easily reach the offset region. When the SW memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the SW memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As obviously understood from the above, in the SW memory cell of the present invention, the drain current ratio between the writing operation and the erasing operation can be particularly made high.

Embodiment 10

This embodiment relates to a computer system in which the plurality of SW memory devices according to Embodiments 1–8 are arranged and to a method for operating the computer system.

Some portions of the detailed descriptions which follow are presented in terms of symbolic representations of operations on data bits within a computer memory. More specifically, the operations are those performed using physical quantities in the form of electrical or magnetic signals capable of being stored, transferred, combined, compared and otherwise manipulated. These signals are referred to as bits, values, elements, symbols, characters, terms, numbers or the like as required.

Further, the manipulations performed are often referred to in terms, such as adding or comparing. The operations are machine operations. Useful machines for performing the operations of the present invention include general purpose digital computers or other similar devices. In all cases, the distinction between the method for operating a computer and the method of computation itself should be borne in mind. There will be described hereafter a computer system for processing electrical signals or other (for example, mechanical or chemical) physical signals to generate other desired physical signals and a method for operating the computer system.

Figure 24:
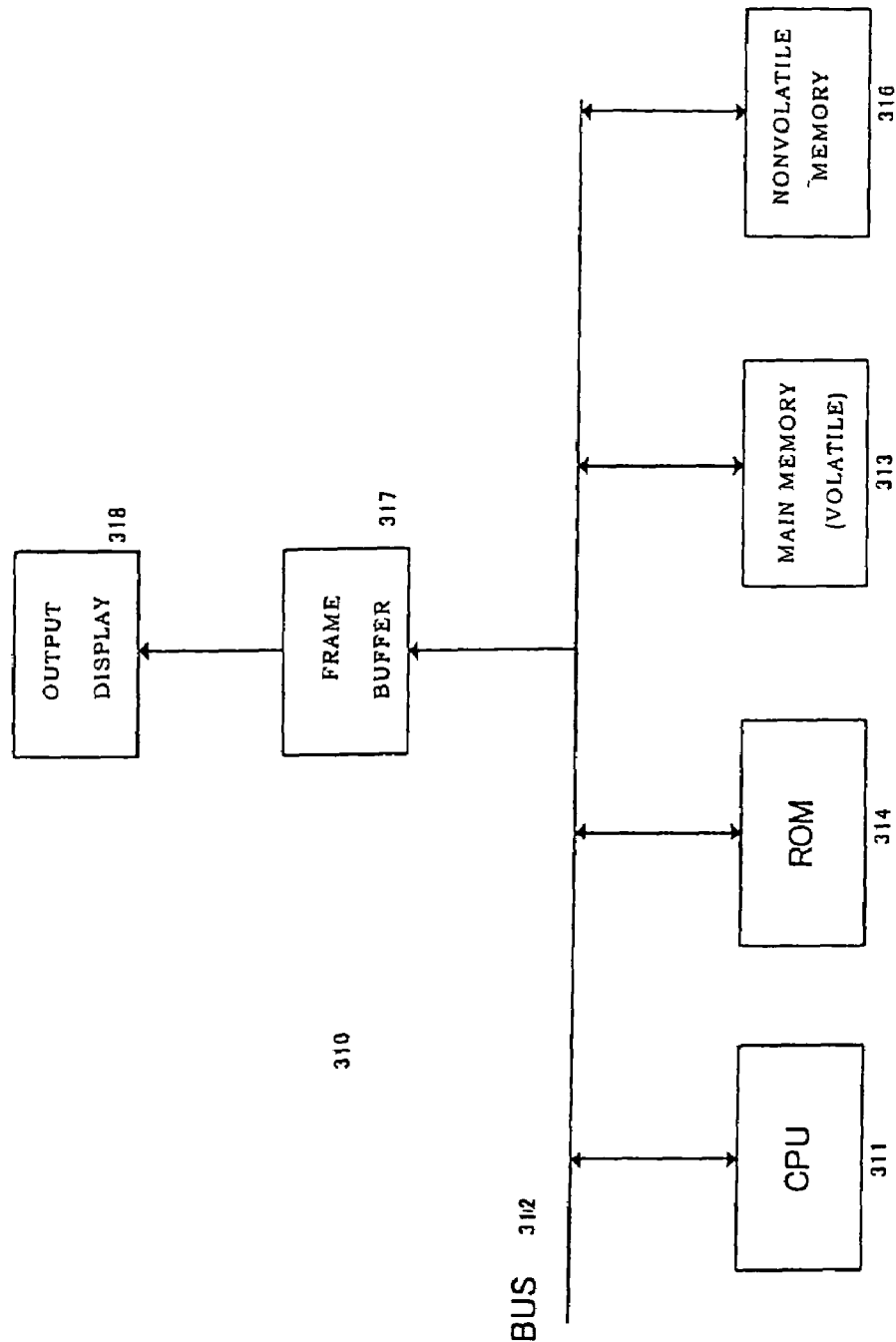
FIG. 24 is a block diagram of a computer system according to the present invention (Tenth Embodiment)

Referring now to FIG. 24, there is illustrated a computer system 310. The computer system 310 includes a CPU (central processing unit) 310 which carries out the various instructions provided to the system 310 for operating a computer. The CPU 311 is joined to a bus 312 adapted to carry information to various components of the system 310. Joined to the bus 312 is a main memory 313 which is typically constructed of a volatile memory a typical example of which is a dynamic random access memory arranged in a manner known to those skilled in the art to store information during a period in which power is provided to the system 310. Also jointed to the bus 312 is a ROM (read only memory) 314 which may include various memory devices well known to those skilled in the art each of which is adapted to retain a particular memory condition in the absence of power to the system 310. The ROM 314 typically stores various basic functions used by the CPU 311 such as basic input/output processes and start processes typically referred to as BIOS processes. The memory 314 is constructed of an SW memory device adapted to be modified as some of the BIOS processes used by a particular computer are changed. The SW memory device may be modified by running an update process on the computer itself to reprogram the values stored in the memory 314.

A memory array with a plurality of SW memory devices (hereafter, referred to as SW memory device array) may include circuitry for programming the SW memory devices.

There may also be connected to the bus 312 various peripheral components such as a nonvolatile memory 316 for long term memory retention and circuitry such as a frame buffer 317 to which data may be written which is transferred to an output display 318 such as a monitor for display. The construction and operation of the nonvolatile memory 316 (typically electromechanical hard disk drives) may be well known to those skilled in the art. However, rather than the typical electromechanical hard disk drive, the SW memory device may be used as the nonvolatile memory 316. Such an SW memory device may be programmed through techniques which utilize voltages greater than those typically available to integrated circuits of more advanced portable computers. The SW memory device array may include circuitry for programming the SW memory device array. Consequently, in accordance with the present invention, the nonvolatile memory 316 as well as the memory 314 may provide circuitry for generating high voltages from lower voltages available from the batteries typically utilized with such computers.

In programming with data the SW memory device array used for the above purpose, signals of programming are input to the SW memory device from the CPU. At this time, the aforementioned voltage is applied to a SW memory transistor to be programmed. Further, the programming is verified to improve the accuracy of programming and also to confirm whether voltage reapplication is required. In general, current memories output data of a word (16 bits) per address, and thus inevitably the programming is accomplished a word at a time and requires that the source of each of cells be placed at five volts and the gate at five volts, and the drain be grounded. The above voltages applied to the source and drain electrodes are the same as those furnished during reading of data.

When the SW memory devices run at a low voltage such as 3V or 1.8V mains, there are generally provided charge pumps to generate inside a higher voltage for the programming mentioned above. However, since these charge pumps are not able to provide sufficient current, it is necessary to arrange in parallel charge pumps which generate the same potential or to increase the capacity utilized by charge pumps when a higher current is aimed.

Figure 25:
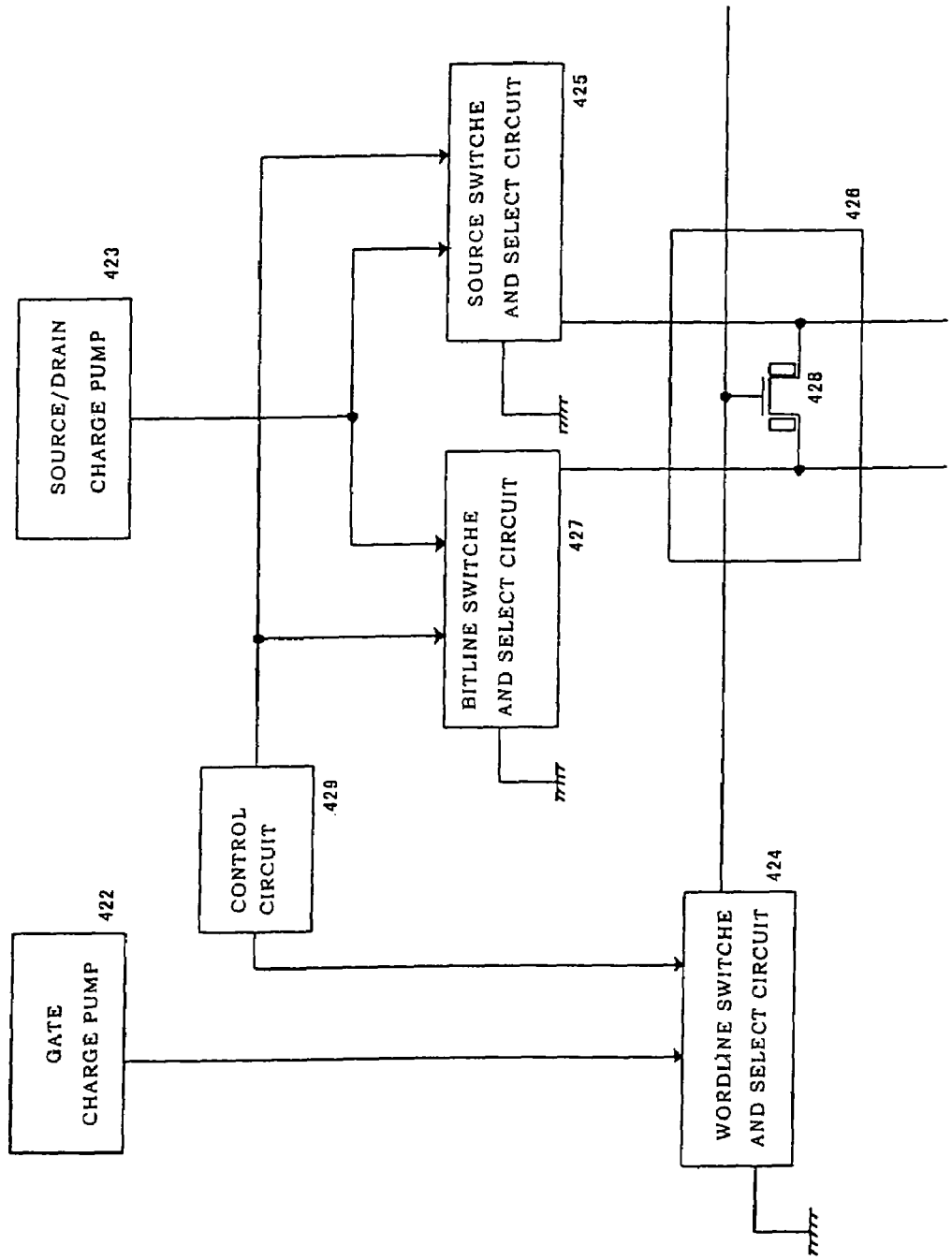
FIG. 25 is a block diagram of circuitry for programming the SW memory device array according to the present invention (Tenth Embodiment)

FIG. 25 is a block diagram which illustrates an integrated circuit including an SW memory device array 426 and circuitry for programming the SW memory device array 426. Voltages to electrodes connected to a memory cell are provided to a gate charge pump 422 and a source/drain charge pump 423. The gate charge pump 422 is devised to provide a pumped output voltage of approximately five volts while the source/drain charge pump 423 is also devised to produce a pumped output voltage of approximately five volts. It should be borne in mind that a required voltage of five volts must be applied to the respective electrodes of the SW memory cell. The gate charge pump and source/drain charge pump each must be devised to provide a magnitude of voltage determined in consideration of a possibility that a parasitic load such as a wiring resistance or a current path within a switching circuit may be generated between each of the charge pumps and the memory cell.

The voltage from the gate charge pump 422 is furnished to a set of wordline switches and select circuits 424 which provide voltages at the gate terminals of a SW memory transistor devices 428 (only one transistor 428 is illustrated in FIG. 25). The voltage from the source/drain charge pump 423 is furnished to a set of bitline switches and select circuits 427 which provide voltages at the drain terminals of the SW memory transistors 428, and is also furnished to a set of source switches and select circuits 425 which provide voltages at the source terminals.

Each of the three sets of switches and select circuits 424, 425 and 427 is controlled by signals from a control circuit 429 to provide appropriate voltages at programming. The control circuit 429 may be a microprocessor designed to provide control of all of the operations of the SW memory device array 426 including reading and programming among other things.

As described above, during programming of the SW memory transistor 428, the drain is typically grounded while five volts is applied to the gate terminal and five volts is applied to the source terminal. Because the high voltage is applied to each of the gate terminal and drain terminal, a substantial source current will flow during programming. Because of this substantial source current when programming is conducted, the source/drain charge pump 423 which supplies a source current mush be able to furnish a substantial amount of current, and the substantial amount of current must be furnished by arranging a plurality of charge pumps in parallel or increasing the capacity utilized by the charge pumps, as mentioned above.

The SW memory device can perform writing with a lower current than a flash EEPROM, and the SW memory device can employ a charge pump with a lower capability of furnishing current than the flash EEPROM. However, the charge pump of the SW memory device must be able to furnish a large amount of current when writing of data of a word is carried out as in the above system.

In order to further reduce the current used in programming the SW memory device array, a circuit according to the present invention is provided. In this circuit, rather than programming all of the bits of a word at once as has been done in prior art structures, the four sets of bits are sequentially programmed, a set of four bits at a time. Thus, the amount of current used at once for programming the SW memory device array can be reduced to one fourth and the current furnishing capability required of the charge pump can be lowered. Consequently, the area occupied by the charge pumps can be reduced.

Figure 26:
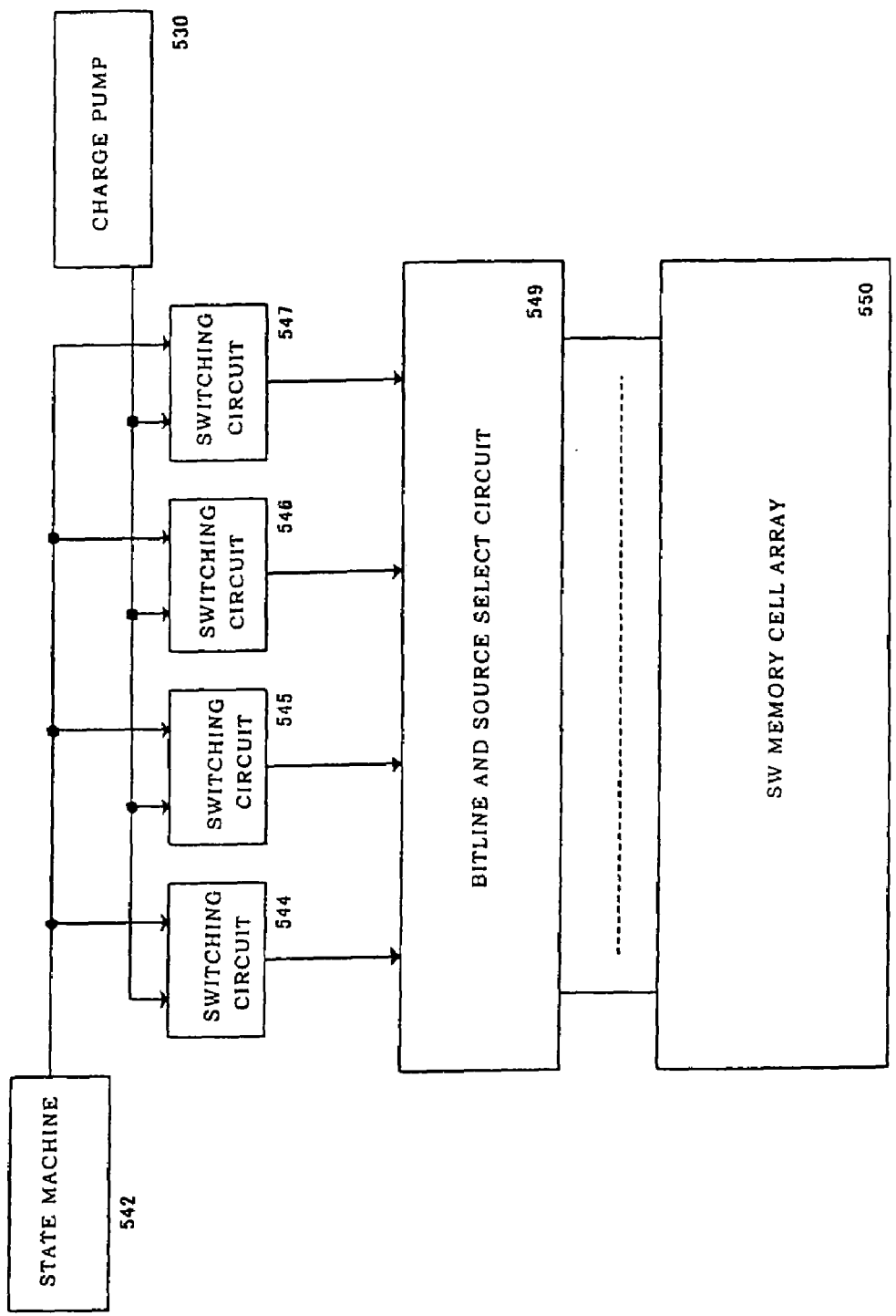
FIG. 26 is a block diagram of circuitry for controlling an external voltage of a charge pump according to the present invention (Tenth Embodiment)

The output voltage provided by the charge pump is connected to supply the drain voltage required for programming cells of four bits within the word selected so that the current required at the output terminal of the charge pump is reduced. Referring to FIG. 26, the output of the charge pump is supplied to one after another of the four sets of bitlines through the respective switching circuits connected to each set of bitlines which cooperate with a bit line/source line select circuit. In this manner, a charge pump only needs to furnish enough current to program four memory cells at once. This makes it possible to program the array with one fourth of the programming current required for programming 16-bit cells which constitute a word. The number of bits selected as a set to be programmed is a function of the current capacity of a particular charge determined by the size of a charge pump. In particular cases, the number of bits according to the present invention is not limited to four but may be more or less than four.

As illustrated in FIG. 26, a charge pump 530 provides an output voltage and current which is used for programming a word of the memory array. The output voltage is provided to four individual switching circuits 544–547. Each of these switching circuits 544–547 receives input control signals from a state machine 542 which enable the application of the voltage provided at the output of the charge pump to one after another of the four sets of bitlines selected at the output of the switching circuits 544–547 in sequence. The state machine sends enabling signals to the switching circuits 544–547 in a constant sequence which repeats for each word which is programmed. Other circuitry such as a controller circuit, a processor, or some other method of generating a sequence of pulses may be used in place of the state machine in particular embodiments to furnish the enabling signals.

FIG. 27 illustrates the flow of the programming process performed by these control circuits. As is shown, a first enabling signal is generated by the state machine 542 and transferred to the first switching circuit 544 of the individual switching circuits 544–547. The circuit 544 controls, for example, the transfer of voltage to bits 0 through 3 of the word selected to be programmed. This first enable signal allows the voltage provided by the charge pump 530 to be applied to the four bitlines connected to one of the switching circuits 544–547 which are to be programmed for transfer to the source terminals of the memory device. In each case, the actual bitlines to be programmed are selected by a bitline select circuit (which also serves as a source line select circuit) 549.

The appropriate high voltage has been applied to the sources of SW memory devices connected to the bitlines of the first set of bitlines to be programmed and the programming has occurred. After the programming of the first set of bitlines is completed, another (second) enable signal is generated by the state machine 542 and transferred to the second switching circuits 545 so that the voltage provided by the charge pump 530 may be applied to those ones of the four bitlines (for example, bits 4 through 7 of the selected word being programmed) connected to that switching circuit 545 to be programmed. This generation of enabling pulses and programming of sets of four bitlines continues in sequence until all of the bits of the word have been programmed. Each set of four bits is programmed at once. After each set of four bits is programmed, a test may be run to determine whether additional sets of bits exist in the word which are yet to be programmed. After the word has been programmed, its programming may be verified.

Eleventh Embodiment

Figure 20:
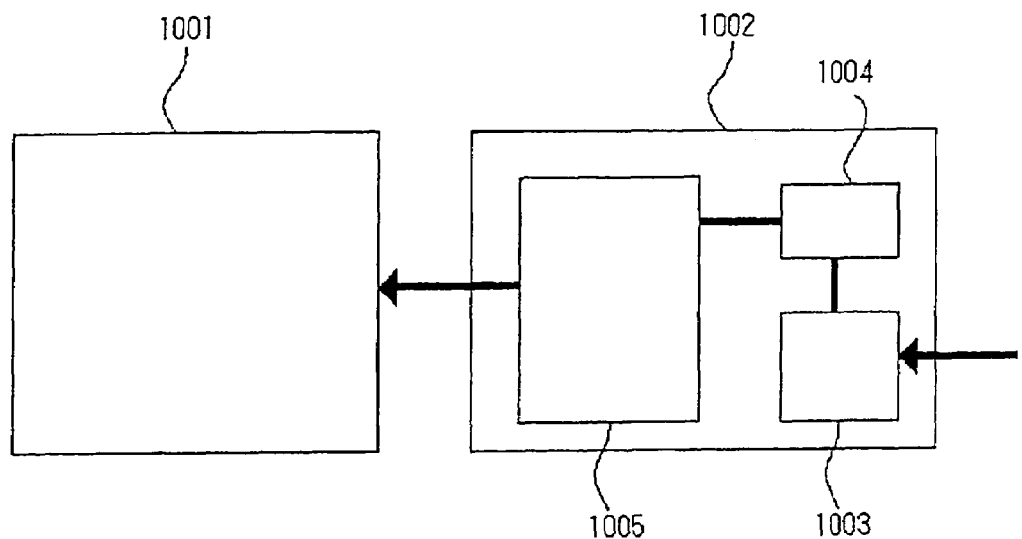
FIG. 20 is a schematic block diagram of a liquid crystal device assembled a semiconductor memory device of the present invention (Eleventh Embodiment)

As an application example of the SW memory cell, for example, as shown in FIG. 20, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the SW memory cell of the present invention, more preferably, any of the SW memory cells of the first to eight embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 20 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the SW memory cell of the present invention. Particularly, it is preferable to use any of the SW memory cells of the first to eighth embodiments in which SW memory cells of the present invention are integrated.

A process for forming the SW memory cell together with a liquid crystal driver and the like is easy, by using the SW memory cell of the present invention as the nonvolatile memory for image adjustment of the liquid crystal panel, so that the manufacturing cost can be reduced. Any of the SW memory cells of the first to eighth embodiments is relatively small and is particularly suitable in the case where reliability or stability is important. Since outputs of two SW memory cells (paired SW memory cells) are inputted to the same sense amplifier and the difference between currents flowing in the two SW memory cells having similar device structures is detected, the reading operation can be performed stably and reliably. Consequently, an area per bit increases. However, when the memory scale is small, as compared with the other circuit area, the increasing ratio is permissible. Usually, a nonvolatile memory for image adjustment of a liquid crystal panel has a capacity of, for example, a few kilobytes, and its memory scale is relatively small. Therefore, it is particularly preferable to use any of the SW memory cells of the first to eighth embodiments as the nonvolatile memory for image adjustment of the liquid crystal panel.

Twelfth Embodiment

Figure 21:
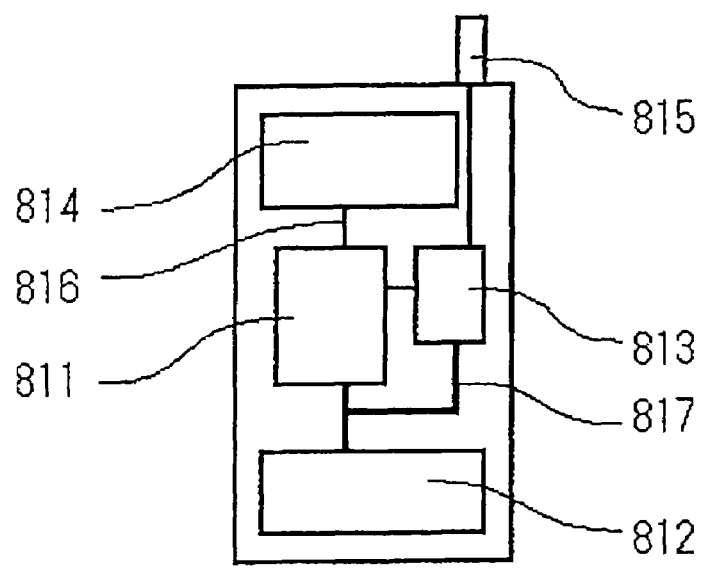
FIG. 21 is a schematic block diagram of a portable electronic apparatus assembled a semiconductor memory device of the present invention (Twelfth Embodiment)
Figure 22:
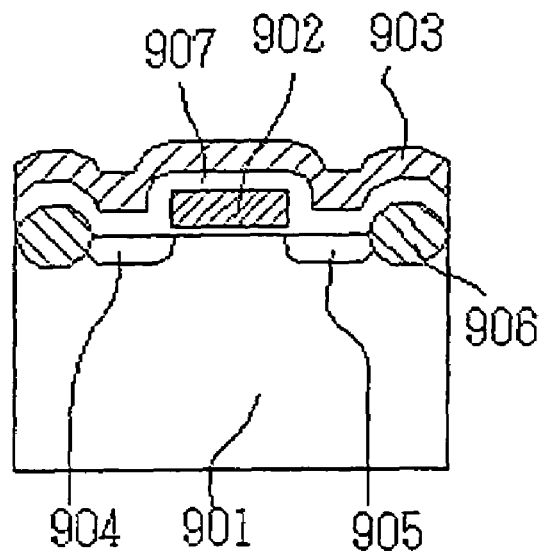
FIG. 22 is a schematic sectional view of a principal portion of a flash memory of the prior art.

FIG. 21 shows a portable telephone as a portable electronic apparatus in which the SW memory cell is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the SW memory cell of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

The operation speed of the portable electronic apparatus is increased, and the manufacturing cost can be reduced, by using the SW memory cell capable of performing high-speed reading operation and whose process of mounting a memory part and a logic circuit part simultaneously is easy for a portable electronic apparatus. Thus, a cheap, high-reliability, and high-performance portable electronic apparatus can be obtained.

Since the SW memory cell has separately the memory function of the memory functional unit and the transistor operation function of the gate insulating film, without deteriorating the memory function, the gate insulating film can be thinned and the short channel effect can be suppressed.

Further, the value of current flowing between the diffusion regions changes by rewriting more largely as compared with an EEPROM. Therefore, the writing state and the erasing state of the SW memory cell can be easily discriminated from each other, so that the reliability can be improved.

Moreover, the SW memory cell forming process is highly compatible with the normal transistor forming process. Thus, as compared with the case of constructing the semiconductor memory device by forming the conventional flash memory as a nonvolatile memory cell together with an amplifier as a normal transistor, the number of masks and the number of processes can be dramatically reduced. Therefore, the yield of the chip on which the amplifier and the nonvolatile memory cell are simultaneously mounted is improved, the cost is reduced, and the cheap, very reliable SW memory cell can be obtained.

Since a display device of the present invention has the SW memory cell, for example, the SW memory cell can be used to store information for correcting variations in display after a display panel is manufactured, thereby enabling the picture qualities of products of display devices to be made uniform. Moreover, the process for forming both a SW memory cell and a logic circuit part is easy, so that the manufacturing cost can be suppressed. Thus, a cheap and reliable display device can be obtained.

Since an electronic apparatus of the present invention, particularly, a portable electronic apparatus has the semiconductor memory device, the process for forming both a SW memory cell and a logic circuit part is easy, the operation speed of the electronic apparatus can be improved, the manufacturing cost can be reduced, and the cheap and reliable display device can be obtained.

What is claimed is:

1. A computer system comprising:
   (A) a CPU (central processor unit);
   (B) a memory arrangement comprising:
      (i) a side-wall memory array including a plurality of side-wall memory transistors and sets of bitlines, each side-wall memory transistor having a side-wall portion;
      (ii) a charge pump for providing a voltage to accumulate negative charges in the side-wall portion of each side-wall memory transistor during a programming operation;
      (iii) a plurality of switching circuits each coupled to the charge pump for receiving the voltage provided by the charge pump and for transferring the voltage to selected sets of the sets of bitlines of the side-wall memory array; and
      (iv) logic circuitry for enabling the plurality of switching circuits in a selected sequential order; and
   (C) a system bus for transferring data and addresses between the CPU and the memory arrangement,
   wherein each of the side-wall memory transistors comprises:
      only a single gate electrode formed on a semiconductor layer with a gate insulating film formed on the semiconductor layer;
      a channel region formed below the gate electrode;
      a pair of diffusion regions formed on the both sides of the channel region and having a conductive type opposite to that of the channel region; and
      a pair of memory functional elements formed on both sides of the gate electrode and having a function of retaining charges wherein a writing or erasing operation to a selected one of either of the memory functional elements formed on both sides of the gate electrode can be executed independently from the other unselected memory functional element by controlling each voltage applied to the diffusion regions and the gate electrode, and wherein an overlap amount between the memory functional element and the diffusion region is 10 nm or more.

2. The computer system of claim 1, wherein the side-wall memory transistors are in sets and wherein the plurality of switching circuits are connected to the sets of bitlines, and a switching circuit of the plurality of switching circuits is enabled to transfer a first voltage to a selected set of the sets of bitlines, the selected set being coupled to a set of the sets of side-wall memory transistors to be programmed, until the set of side-wall memory transistors to be programmed has been programmed.

3. The computer system of claim 1, wherein the logic circuitry comprises a state machine, the state machine enabling the plurality of switching circuits in a selected sequential order such that the voltage is applied individually to the sets of bitlines until each set of the sets of bitlines has been programmed.

4. The computer system of claim 3, further comprising a bit line select circuit coupled to the switching circuit to select bitlines of a set to connect to receive the voltage such that the selected bitlines are programmed.

5. The computer system of claim 1, wherein each of the sets includes four bitlines.

6. The computer system of claim 1, wherein the plurality of switching circuits comprise four switching circuits, each switching circuit is coupled to a corresponding set of four bitlines.

7. The computer system of claim 1, the plurality of switching circuits for transferring the voltage to selected sets of the sets of bitlines of the side-wall memory array comprise four switching circuits, a switching circuit is coupled to a corresponding set of four bitlines.

8. A computer system comprising:
   (A) central processing means;
   (B) means for providing storage of data comprising:
      (i) side-wail memory array means including a plurality of side-wall memory transistors and sets of bitlines, each side-wall memory transistor having a side-wall portion;
      (ii) charge pump means for providing a voltage to accumulate negative charges in the side-wall portion of each side-wall memory transistor during a programming operation;
      (iii) a plurality of means for transferring the voltage to selected sets of the sets of bitlines of the side-wall memory array; and
      (iv) means for enabling the plurality of transferring means in a selected sequential order; and
   (C) a system bus means for transferring data and addresses between the central processing means and the means for providing storage of data,
   wherein each of the side-wall memory transistors comprises:
      only a single gate electrode formed on a semiconductor layer with a gate insulating film formed on the semiconductor layer;
      a channel region formed below the gate electrode;
      a pair of diffusion regions formed on the both sides of the channel region and having a conductive type opposite to that of the channel region; and a pair of memory functional elements formed on both sides of the gate electrode and having a function of retaining charges wherein a writing or erasing operation to a selected one of either of the memory functional elements formed on both sides of the gate electrode can be executed independently from the other unselected memory functional element by controlling each voltage applied to the diffusion regions and the gate electrode, and wherein an overlap amount between the memory functional element and the diffusion region is 10 nm or more.

9. The computer system of claim 8, wherein the side-wall memory transistors are in sets and wherein selected transferring means of the plurality of transferring means is connected to a selected set of the sets of bitlines, and is enabled to transfer a first voltage to the selected set of the sets of bitlines, the selected set being coupled to a set of the sets of side-wall memory transistors to be programmed, until the set of side-wall memory transistors to be programmed has been programmed.

10. The computer system of claim 8, wherein the enabling means comprises a state machine, the state machine enabling each of the transferring means such that the voltage is applied individually to the sets of bitlines until each set of the sets of bitlines has been programmed.

11. The computer system of claim 8, wherein each of the sets includes four bitlines.

12. The computer system of claim 8, wherein the plurality of transferring means comprise four switching circuits.

13. The system of either claim 1 or claim 8 wherein the pair of diffusion regions are disposed so as to offset with an end of the gate electrode.

14. The system of either claim 1 or claim 8 wherein the diffusion region is disposed so as to overlap with the memory functional element.

15. The system of either claim 1 or claim 8 wherein a distance between an end of the gate electrode and an end of the diffusion region on the channel region side is less than 100 nm.

16. The system of either claim 1 or claim 8 wherein the memory functional element is formed by at least any one of an insulating film including an insulator having the function of retaining charges, an insulating film including at least one conductor or semiconductor dot, and an insulating film including a ferroelectric him of which inner charge is polarized by an electric field and in which the polarized state is held.

17. A memory structure comprising:
(i) a side-wall memory array including a plurality of side-wall memory transistors and sets of bitlines, each side-wall memory transistor having a side-wall portion;
(ii) a charge pump for providing a voltage to accumulate negative charges in the side-wall portion of each side-wall memory transistor during a programming operation;
(iii) a plurality of switching circuits each coupled to the charge pump for receiving the voltage provided by the charge pump and for transferring the voltage to selected sets of the sets of bitlines of the side-wall memory array; and
(iv) logic circuitry for enabling the plurality of switching circuits in a selected sequential order,
wherein each of the side-wall memory transistors comprises:
only a single gate electrode formed on a semiconductor layer with a gate insulating film formed on the semiconductor layer;
a channel region formed below the gate electrode;
a pair of diffusion regions formed on the both sides of the channel region and having a conductive type opposite to that of the channel region; and
a pair of memory functional elements formed on both sides of the gate electrode and having a function of retaining charges wherein a writing or erasing operation to a selected one of either of the memory functional elements formed on both sides of the gate electrode can be executed independently from the other unselected memory functional element by controlling each voltage applied to the diffusion regions and the gate electrode, and wherein an overlap amount between the memory functional element and the diffusion region is 10 nm or more.

18. The memory structure of claim 17, wherein the side-wall memory transistors are in sets and wherein the plurality of switching circuits are connected to the sets of bitlines, and a switching circuit of the plurality of switching circuits is enabled to transfer a first voltage to a selected set of the sets of bitlines being coupled to a set of the sets of side-wall memory transistors to be programmed, until the set of side-wall memory transistors to be programmed has been programmed.

19. The memory structure of claim 17, wherein the logic circuitry comprises a state machine, the state machine enabling the plurality of switching circuits in a selected sequential order such that the voltage is applied individually to the sets of bitlines until each set of the sets of bitlines has been programmed.

20. The memory structure of claim 19, further comprising a bit line select circuit coupled to the switching circuit to select bitlines of a set to connect to receive the voltage such that the selected bitlines are programmed.

21. The memory structure of claim 17, wherein each of the sets includes four bitlines.

22. The memory structure of claim 17, wherein the plurality of switching circuits comprise four switching circuits, each switching circuit is coupled to a corresponding set of four bitlines.

23. A structure for providing storage of data, comprising:
(i) side-wall memory array means including a plurality of side-wall memory transistors and sets of bitlines, each side-wall memory transistor having a side-wall portion;
(ii) charge pump means for providing a voltage to accumulate negative charges in the side-wall portion of each side-wall memory transistor during a programming operation;
(iii) a plurality of means for transferring the voltage to selected sets of the sets of bitlines of the side-wall memory array; and
(iv) means for enabling the plurality of transferring means in a selected sequential order,
wherein each of the side-wall memory transistors comprises:
only a single gate electrode formed on a semiconductor layer with a gate insulating film formed on the semiconductor layer;
a channel region formed below the gate electrode;
a pair of diffusion regions formed on the both sides of the channel region and having a conductive type opposite to that of the channel region; and
a pair of memory functional elements formed on both sides of the gate electrode and having a function of retaining charges wherein a writing or erasing operation to a selected one of either of the memory functional elements formed on both sides of the gate electrode can be executed independently from the other unselected memory functional element by controlling each voltage applied to the diffusion regions and the gate electrode, and wherein an overlap amount between the memory functional element and the diffusion region is 10 nm or more.

24. The structure for providing storage of data of claim 23, wherein the side-wall memory transistors are in sets and wherein the plurality of transferring means are connected to the sets of bitlines, and transferring means of the plurality of transferring means is enabled to transfer a first voltage to a selected set of the sets of bitlines, the selected set being coupled to a set of the sets of side-wall memory transistors to be programmed, until the set of side-wall memory transistors to be programmed has been programmed.

25. The structure for providing storage of data of claim 23, wherein the enabling means comprises a state machine, the state machine enabling the plurality of transferring means such that the voltage is applied individually to the sets of bitlines until each set of the sets of bitlines has been programmed.

26. The structure for providing storage of data of claim 23, wherein each of the sets includes four bitlines.

27. The structure for providing storage of data of claim 23, the plurality of means for transferring the voltage to selected sets of the sets of bitlines of the side-wall memory array comprise four switching circuits, a switching circuit is coupled to a corresponding set of four bitlines.

28. The structure of either claim 17 or claim 23 wherein the pair of diffusion regions are disposed so as to offset with an end of the gate electrode.

29. The structure of either claim 17 or claim 23 wherein the diffusion region is disposed so as to overlap with the memory functional element.

30. The structure of either claim 17 or claim 23 wherein a distance between an end of the gate electrode and an end of the diffusion region on the channel region side is less than 100 nm.

31. The structure of either claim 17 or claim 23 wherein the memory functional element is formed by at least any one of an insulating film including an insulator having the function of retaining charges, an insulating film including at least one conductor or semiconductor dot, and an insulating film including a ferroelectric film of which inner charge is polarized by an electric field and in which the polarized state is held.

* * * * *